(12) United States Patent
Maki

(10) Patent No.: US 10,319,891 B2
(45) Date of Patent: Jun. 11, 2019

(54) LIGHT EMITTING MODULE AND LIGHT EMITTING MODULE MANUFACTURING METHOD

(71) Applicant: TOSHIBA HOKUTO ELECTRONICS CORPORATION, Asahikawa-Shi (JP)

(72) Inventor: Keiichi Maki, Suita (JP)

(73) Assignee: Toshiba Hokuto Electronics Corporation, Asahikawa-Shi (JP)

(*) Notice: Subject to any disclaimer, the term of this patent is extended or adjusted under 35 U.S.C. 154(b) by 0 days.

(21) Appl. No.: 15/465,899

(22) Filed: Mar. 22, 2017

(65) Prior Publication Data
US 2017/0250330 A1 Aug. 31, 2017

Related U.S. Application Data

(63) Continuation of application No. PCT/JP2015/004816, filed on Sep. 18, 2015.

(30) Foreign Application Priority Data
Sep. 26, 2014 (JP) .................. 2014-196387

(51) Int. Cl.
H01L 33/62 (2010.01)
H01L 33/56 (2010.01)
(Continued)

(52) U.S. Cl.
CPC .......... *H01L 33/62* (2013.01); *H01L 25/0753* (2013.01); *H01L 33/06* (2013.01);
(Continued)

(58) Field of Classification Search
CPC ..... H01L 33/62; H01L 25/0753; H01L 33/32; H01L 33/06; H01L 33/56; H01L 2933/005; H01L 2933/0066
See application file for complete search history.

(56) References Cited

U.S. PATENT DOCUMENTS 8,937,329 B2 1/2015 Katayama
2004/0099367 A1* 5/2004 Nakamura ............ B32B 27/08
156/182
(Continued)

FOREIGN PATENT DOCUMENTS

EP 2 637 225 9/2013
EP 2 674 993 12/2013
(Continued)

OTHER PUBLICATIONS

International Search Report and Written Opinion (Application No. PCT/JP2015/0004816) dated Dec. 1, 2015.
(Continued)

Primary Examiner — Mohammed R Alam
(74) Attorney, Agent, or Firm — Burr & Brown, PLLC

(57) ABSTRACT

A light emitting module includes a first light transmissive insulator, a conductive circuitry layer formed on a surface of the first light transmissive insulator, a second light transmissive insulator disposed so as to face the conductive circuitry layer, a light emitting element disposed between the first light transmissive insulator and the second light transmissive insulator, and connected to the conductive circuitry layer, and a third light transmissive insulator which is disposed between the first light transmissive insulator and the second light transmissive insulator, and which is thermosetting.

29 Claims, 14 Drawing Sheets

(51) Int. Cl.
*H01L 25/075* (2006.01)
*H01L 33/06* (2010.01)
*H01L 33/32* (2010.01)

(52) U.S. Cl.
CPC .............. *H01L 33/32* (2013.01); *H01L 33/56* (2013.01); *H01L 2224/16225* (2013.01); *H01L 2933/005* (2013.01); *H01L 2933/0066* (2013.01)

(56) References Cited

U.S. PATENT DOCUMENTS

| | | | |
|---|---|---|---|
| 2009/0131609 A1* | 5/2009 | Ochi | C08G 59/226 |
| | | | 525/534 |
| 2009/0289275 A1* | 11/2009 | Hayashi | B29C 45/0025 |
| | | | 257/99 |
| 2013/0234186 A1 | 9/2013 | Katayama | |
| 2013/0248889 A1 | 9/2013 | Lin | |
| 2013/0328100 A1 | 12/2013 | Kono et al. | |
| 2015/0087095 A1 | 3/2015 | Katayama | |
| 2015/0249069 A1* | 9/2015 | Yoshida | H01L 33/62 |
| | | | 257/89 |

FOREIGN PATENT DOCUMENTS

| | | |
|---|---|---|
| JP | 07-122787 A1 | 5/1995 |
| JP | 2008-034473 A1 | 2/2008 |
| JP | 2010-123802 A1 | 6/2010 |
| JP | 2011-134926 | 7/2011 |
| JP | 2011-228463 A1 | 11/2011 |
| JP | 2012-084855 A1 | 4/2012 |

OTHER PUBLICATIONS

Chinese Office Action (and translation provided by foreign counsel) from a corresponding Chinese patent application (CN 2015800437393) dated Mar. 29, 2018, 29 pages.
Supplementary European Search Report from a corresponding European patent application (EP 15845234.2) dated Feb. 22, 2018.
Japanese Office Action (and an English Translation downloaded from EPO Global Dossier) from a corresponding Japanese patent application (JP2016-549955) dated Mar. 13, 2018.

* cited by examiner

LIGHT EMITTING MODULE AND LIGHT EMITTING MODULE MANUFACTURING METHOD

CROSS-REFERENCE TO RELATED APPLICATION

This application is a continuation of prior International Application No. PCT/JP2015/004816 filed on Sep. 18, 2015, which is based upon and claims the benefit of priority from Japanese Patent Application No. 2014-196387 filed on Sep. 26, 2014, the entire contents of which are incorporated herein by reference.

FIELD

Embodiments of the present disclosure relate to a light emitting module, and a light emitting module manufacturing method.

BACKGROUND

Light emitting modules including light emitting elements like a Light Emitting Diode (LED) are broadly applied to indoor, outdoor, stationary, and movable display devices, indication lamps, various switches, signaling devices, and optical devices like a commonly used lighting device. Among such light emitting modules that include LEDs, a light transmissive emitting module that has multiple LEDs disposed between two light transmissive substrates is known as a suitable device for display devices and indication lamps that display various letter strings, geometric figures, and patterns.

By applying flexible substrates formed of a light transmissive resin as the light transmissive substrates, a constraint for an attaching surface for the light emitting module as the display device and the indication lamp is eased, and thus the convenience and availability of the light transmissive emitting module are improved.

A light transmissive emitting module employs a structure that has multiple LED chips disposed between a pair of light transmissive insulation substrates each including a conductive circuitry layer. Each of the multiple LED chips includes a pair of electrodes, and the electrodes are electrically connected to the conductive circuitry layer formed on the light transmissive insulation substrate. A flexible light transmissive resin is filled in between the pair of light transmissive insulation substrates. The LED chip is held by the light transmissive resin with the electrodes being in contact with the corresponding pieces of the conductive circuitry layer.

In the above light emitting module, an improvement for the connection reliability between the electrode of the LED chip and the conductive circuitry layer is desired.

DETAILED DESCRIPTION

A light emitting module according to an embodiment includes a first light transmissive insulator, a conductive circuitry layer formed on a surface of the first light transmissive insulator, a second light transmissive insulator disposed so as to face the conductive circuitry layer, a light emitting element disposed between the first light transmissive insulator and the second light transmissive insulator, and connected to the conductive circuitry layer, and a third light transmissive insulator which is disposed between the first light transmissive insulator and the second light transmissive insulator, and is thermosetting.

Figure 1:
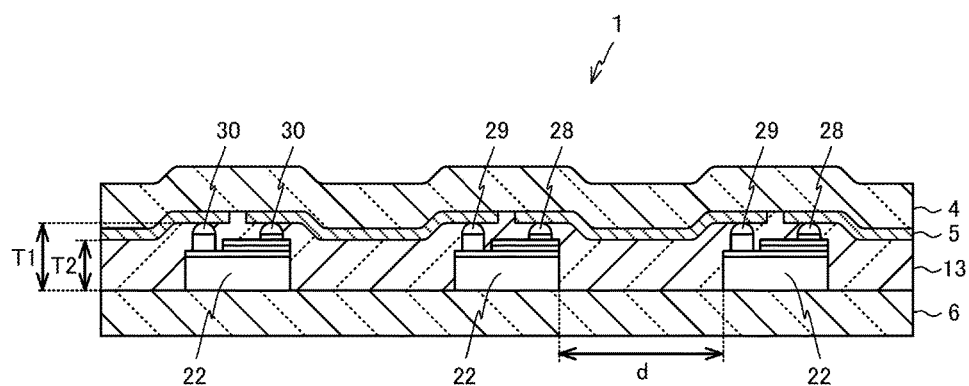
FIG. 1 is an exemplary cross-sectional view illustrating a general structure of a light emitting module in accordance with an embodiment.

A light emitting module in accordance with a first embodiment of the present disclosure will be explained below with reference to the figures. FIG. 1 is an exemplary cross-sectional view illustrating a general structure of a light emitting module 1 in accordance with this embodiment.

As illustrated in FIG. 1, the light emitting module 1 includes a pair of light transmissive films 4, 6, a resin layer 13 formed between the light transmissive films 4, 6, and multiple light emitting elements 22 disposed within the resin layer 13.

The light transmissive films 4, 6 are each a rectangular film that has a planar lateral direction as a lengthwise direction. The light transmissive films 4, 6 each have a thickness of 50 to 300 μm, and have a light transmissive property for visible light. It is preferable that the total light transmittance of the light transmissive films 4, 6 should be equal to or greater than 90%, and more preferably, equal to or greater than 95%. The total light transmittance means a total light transmittance measured in compliance with JIS K7375: 2008. In addition, both the light transmissive films 4, 6 are flexible, and have abending elastic modulus that is substantially 0 to 320 kgf/mm$^2$ (excluding zero). The bending elastic modulus means a value measured through a scheme in compliance with, for example, ISO 178 (JIS K7171: 2008).

When the thickness of the light transmissive films 4, 6 exceeds 300 μm, the flexibility of the light transmissive films 4, 6, decreases, and the total light transmittance thereof decreases. In addition, when the thicknesses of the light transmissive films 4, 6 becomes lower than 5 μm, a large deformation of the light transmissive films 4, 6 is expected when the light transmissive films 4, 6 are integrated with the light emitting elements 22. Hence, it is preferable that the light transmissive films 4, 6 should have a thickness of 50 to 300 μm.

Example materials of the light transmissive films 4, 6 are polyethylene-terephthalate (PET), polyethylene-naphthalate (PEN), polycarbonate (PC), polyethylene-succinate (PES), a cyclic-olefin resin (e.g., ARTON (product name) available from JSR Corporation), and an acrylic resin.

In the pair of light transmissive films 4, 6, a lower surface of the light transmissive film 4 is formed with multiple pieces of a conductor pattern 5 that has a thickness of substantially 0.05 to 2 μm.

For the conductor pattern 5, a light transmissive conductive material, such as an Indium Tin Oxide (ITO), Fluorine-doped Tin Oxide (FTO), zinc oxide, or Indium Zinc Oxide (IZO), is applied. The conductor pattern 5 can be formed by, for example, patterning like laser processing or etching performed on a thin film formed on the light transmissive film 4 by sputtering or electron beam vapor deposition.

The conductor pattern 5 can be also formed on the light transmissive film 4 by screen printing of a mixture material of particles of a light transmissive conductive material having an average particle diameter of 10 to 300 nm with a light transmissive resin binder. In addition, the conductor pattern 5 can be formed by forming a thin film formed of the above mixture material on the light transmissive film 4, and by patterning this thin film by laser processing or photo-lithography.

The material of the conductor pattern 5 is not limited to the light transmissive conductive material, and particles of a non-light transmissive conductive material, such as gold, silver, or copper, may be applied to the light transmissive film 4 in a meshed shape. For example, a photo-sensitive compound of a non-light transmissive conductive material like halogenated silver may be applied to the light transmissive film 4 to form a thin film, and exposure and development may be performed on this thin film to form the conductor pattern 5 in a meshed shape. In addition, a slurry containing the particles of a non-light transmissive conductive material may be applied by screen printing, etc., in a meshed shape to form the conductor pattern 5.

It is preferable that the conductor pattern 5 should have a light transmissive property that sets the total light transmittance (e.g., JIS K7105) of the entire light emitting module 1 to be equal to or greater than 1%. When the total light transmittance of the entire light emitting module 1 is less than 1%, a light emitting dot is not recognized as a bright point. The light transmissive property of the conductor pattern 5 itself varies depending on a structure of the conductor pattern 5, but it is preferable that the total light transmittance should be within the range between 10 and 85%.

The resin layer 13 is an insulator formed between the light transmissive film 4 and the light transmissive film 6. The resin layer 13 is formed of a thermosetting resin, and has a light transmissive property for visible light. The resin layer 13 is formed of a resin with characteristics that satisfy predetermined conditions, such as the lowest melt viscosity prior to curing, a temperature at the lowest melt viscosity prior to curing, a melt viscosity change rate until reaching the temperature at the lowest melt viscosity prior to curing, a Vicat softening temperature after curing, a tensile storage elastic modulus after curing, and a glass transition temperature after curing.

The resin layer 13 in accordance with this embodiment is formed of an epoxy-based resin that is the thermosetting resin. It is desirable that the thermosetting resin which forms the resin layer 13 should have a lowest melt viscosity VC1 prior to curing. a lowest melt viscosity VC1 is within a range between 10 and 10000 Pa·s at the temperature within a range between 80 and 160° C. In addition, it is desirable that a melt viscosity change rate VR until reaching a temperature T1 (maximum softening temperature) at the lowest melt viscosity VC1 prior to curing should be equal to or lower than 1/1000 (equal to or lower than 1 over 1000). It is desirable that the resin layer 13 should have a Vicat softening temperature T2 after reaching the lowest melt viscosity by heating, i.e., after cured which is within a range between 80 and 160° C., and have a tensile storage elastic modulus EM which is within a range between 0.01 and 1000 GPa at a temperature within a range between 0 and 100° C. In addition, it is desirable that the resin layer 13 should have a glass transition temperature T3 of 100 to 160° C.

Example preferable physical values of the thermosetting resin are as follows:

Lowest melt viscosity VC1: 10 to 10000 Pa·s;
Temperature T1 (maximum softening temperature) at lowest melt viscosity VC1: 80 to 160° C.;
Melt viscosity change rate VR until reaching temperature T1: equal to or lower than 1/1000;
Vicat softening temperature T2: 80 to 160° C.;
Tensile storage elastic modulus EM: 0.01 to 1000 GPa at temperature within a range between 0 and 100° C.; and
Glass transition temperature T3: 100 to 160° C.

Note that the melt viscosity measurement was made to obtain a value by changing the temperature of a measurement sample from 50 to 180° C. in accordance with the scheme described in JIS K7233. The Vicat softening temperature was a value obtained under a condition with a test load of 10 N, and a temperature rise speed of 50° C./hour in accordance with A50 described in JIS K7206 (ISO 306: 2004). The glass transition temperature and the melt temperature were obtained by differential scanning calorimetric measurement in accordance with a scheme in compliance with JIS K7121 (ISO 3146). The tensile storage elastic modulus is a value obtained in accordance with a scheme in compliance with JIS K7244-1 (ISO 6721). More specifically, this is a value obtained by performing sampling on a measurement sample that had an constant temperature rise from −100° C. to 200° C. at 1° C. by 1° C. per a minute at a frequency of 10 Hz using a dynamic viscosity automatic measurement apparatus.

The resin layer 13 is filled around electrodes 28, 29 without a void. As illustrated in FIG. 1, the area of each electrode 28, 29 provided on the upper surface of the light emitting element 22 is smaller than the area of the upper surface (e.g., light emitting surface) of the light emitting element 22. In addition, the electrodes 28, 29 protrude from the upper surface of the light emitting element 22 toward the conductor pattern 5. In this case, a microscopic empty space is formed between the upper surface of the light emitting element 22 and the conductor pattern 5. It is preferable that the resin layer 13 should be also filled in this microscopic empty space.

A thickness T2 of the resin layer 13 is smaller than a height T1 of the light emitting element 22 so as to enable the conductor pattern 5 to be excellently in contact with the electrodes 28, 29. The light transmissive film 4 intimately in contact with the resin layer 13 is formed in a curved shape that has a portion where the light emitting element 4 is disposed protruding outwardly, and a portion between the light emitting elements 22 concaved. The curved light transmissive film 4 in this manner pushes the conductor pattern 5 against the electrodes 28, 29. Hence, the electrical connection between the conductor pattern 5 and the electrodes 28, 29, and the reliability thereof are improved.

Note that it is preferable that the resin layer 13 should be formed of a material that contains a main component which is a thermosetting resin, but may contain other resin components as needed. Example known thermosetting resins are an epoxy-based resin, an acrylic-based resin, a styrene-based resin, an ester-based resin, an urethane-based resin, a melamine resin, a phenol resin, an unsaturated polyester resin, and a diallyl phthalate resin. Among those resins, the epoxy-based resin is suitable as a material for the resin layer 13 since it has excellent light transmissive property, electrical insulation characteristic, flexibility, and further fluidity when softened, adhesiveness after cured, and anti-weatherability. The resin layer 13 may be formed of resins other than the epoxy-based resin.

Figure 2:
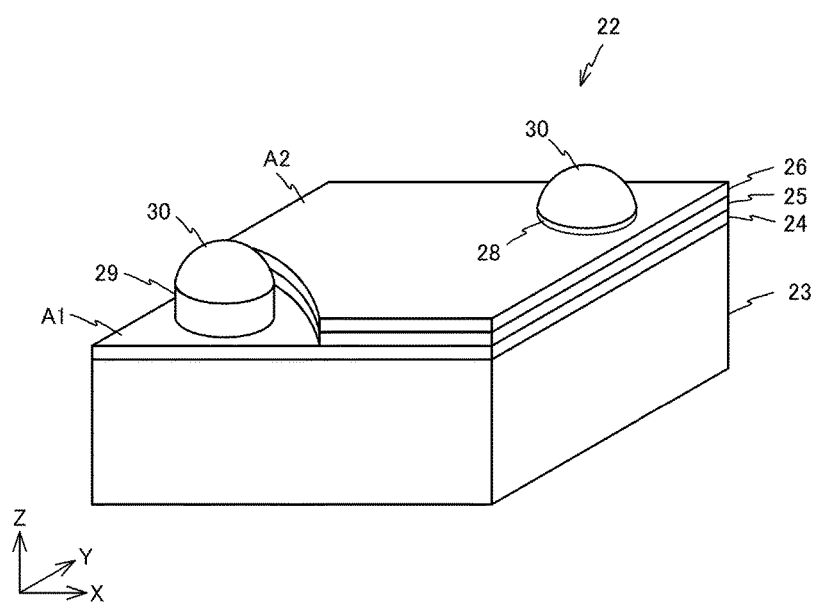
FIG. 2 is a perspective view of a light emitting element.

FIG. 2 is a perspective view illustrating the light emitting element 22. The light emitting element 22 is a square LED chip that has a side of 0.3 to 3 mm. As illustrated in FIG. 2, the light emitting element 22 is an LED chip that includes a base substrate 23, an N-type semiconductor layer 24, an active layer 25, and a P-type semiconductor layer 16. The rated voltage for the light emitting element 22 is substantially 2.5 V.

The base substrate 23 is a sapphire substrate or a semiconductor substrate. By applying the base substrate 23 that has an optical transmissive property, light is emitted from both upper and lower surfaces of the light emitting element 22. The N-type semiconductor layer 23 that is formed in the same shape as the base substrate 23 is formed on the upper surface of the base substrate 23. The N-type semiconductor layer 24 is formed of, for example, n-GaN.

Laid over on the upper surface of the N-type semiconductor layer 24 are an active layer 25 and a P-type semiconductor layer 26 in this sequence. The active layer 25 is formed of, for example, InGaN. In addition, the P-type semiconductor layer is formed of, for example, p-GaN. Note that the light emitting element 22 may employ a Double-Hetero (DH) structure, or a Multi-Quantum Well (MQW) structure.

Cut portions are respectively formed at corner portions of the active layer 25 and the P-type semiconductor layer 26 laid over on the N-type semiconductor layer 24, and a surface of the N-type semiconductor layer 24 is exposed from such cut portions. The exposed portion of the N-type semiconductor layer 24 from the active layer 25 and the P-type semiconductor layer 26 is formed with an electrode 29 (electrode pad) that is electrically connected with the N-type semiconductor layer 24. In addition, the corner portion of the P-type semiconductor layer 26 is formed with the electrode 28 (electrode pad) that is electrically connected to the P-type semiconductor layer 26.

The electrodes 28, 29 are each formed of copper (Cu) or gold (Au), and are each a pad electrode having a conductive bump 30 formed on the upper surface. The bump 30 is a metal bump formed of a metal, such as gold (Au) or a gold alloy. The bump 30 may be a solder bump instead of a metal bump.

The thickness of the light emitting element 22 excluding the bump is substantially 100 μm, and the height of the bump 30 is substantially 60 μm.

The light emitting elements 22 are disposed at an equal pitch so as to have a distance d between the adjacent light emitting elements 22. The distance d is equal to or shorter than 1500 μm. The number of light emitting elements 22 in the light emitting module 1 can be designed as appropriate in accordance with the specification of the light emitting module 1, such as an external dimension, and the light emitting surface area.

Figure 3:
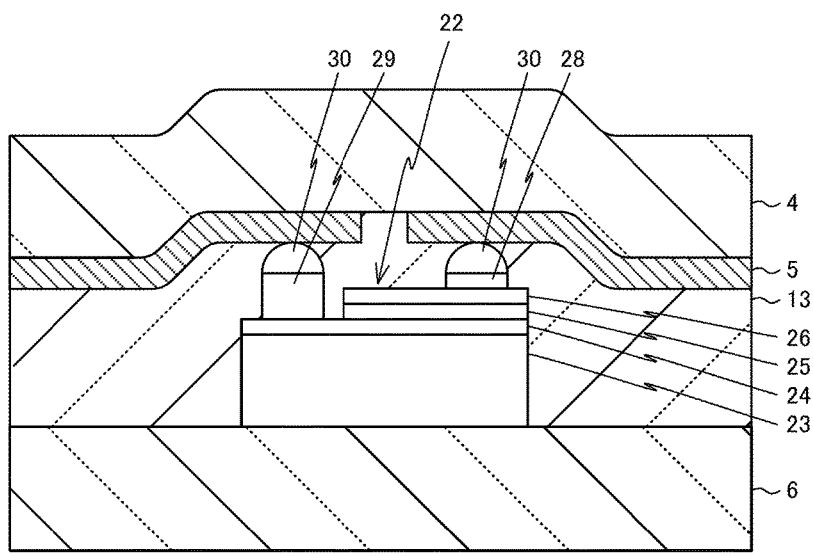
FIG. 3 is a cross-sectional view illustrating an enlarged portion of the light emitting module.

FIG. 3 is a cross-sectional view illustrating a part of the light emitting module 1 in an enlarged-manner. As illustrated in FIG. 3, the electrodes 28, 29 of the light emitting element 22 are electrically connected to the conductor pattern 5 via the respective bumps 30.

The bump 30 is formed of gold, an AuSn alloy, silver, copper, nickel, an alloy with a metal other than the foregoing metals, a mixture material, an eutectic material, an amorphous material, etc. The bump 30 may be formed of a solder, an eutectic solder, a mixture material of metal particles with a resin, an anisotropic conductive film, etc. The bump 30 may be formed as a wire bump using, for example, a wire bonder. In addition, the bump 30 can be also formed by performing electrolytic plating or non-electrolytic plating on the electrode 28, 29. The bump 30 can be also formed by inkjet printing of an ink containing metal particles on the electrode 28, 29 and by calcination. Still further, a paste containing metal particles may be printed or applied to the electrode 28, 29 to form the bump 30, or the bump 30 may be formed on the electrode 28, 29 by technologies, such as ball mounting, pellet mounting, and vapor deposition sputtering.

It is preferable that a melting-point temperature of the bump 30 should be equal to or higher than 180° C., and more preferably, equal to or higher than 200° C. A practical upper limit of the temperature is equal to or lower than 1100° C. When the melting-point temperature of the bump 30 is lower than 180° C., in a vacuum thermal pressing process in the manufacturing process of the light emitting module 1, the bump 30 is largely deformed, and thus the sufficient thickness is not ensured. In addition, the bump 30 may spread out from the electrode 28, 29. In this case, the spreading portions of the bump 30 out from the electrode 28, 29 disrupts traveling light from the light emitting element 22.

The melting-point temperature of the bump 30 is measurable using, for example, a DSC-60 differential scanning calorimeter available from SHIMADZU Corporation. As for the melting-point temperature measurement, for example, a sample of substantially 10 mg is subjected to a temperature rise 5° C. by 5° C. per a minute. When a solidus temperature and a liquidus temperature differ from each other, a value of the solidus temperature may be considered as the melting-point temperature of the bump 30.

A dynamic hardness DHV of the bump 30 is equal to or larger than 3 and equal to or smaller than 150, and preferably, equal to or larger than 5 and equal to or smaller than 100, and more preferably, equal to or larger than 5 and equal to or smaller than 50. When the dynamic hardness DHV of the bump 30 is less than 3, in a vacuum thermal pressing process in the manufacturing process of the light emitting module, the bump 30 is largely deformed, and thus the sufficient thickness is not ensured. In addition, the bump 30 may spread out from the electrode 28, 29. In this case, the spreading portions of the bumps 30 from the electrode 28, 29 disrupt traveling light from the light emitting element 22. Conversely, when the dynamic hardness DHV of the bump 30 exceeds 150, in a vacuum thermal pressing process in the manufacturing process of the light emitting module, the bump 30 deforms the light transmissive film 4. In this, this results in a poor visual inspection result of the light emitting module 1, and a poor connection between the light emitting element 22 and the conductor pattern 5.

The dynamic hardness DHV of the bump 30 is obtained by, for example, a test using a SHIMADZU dynamic ultra-fine hardness gauge DUH-W201S provided by SHIMADZU Corporation. In such a test, under an environment at which the temperature is 20° C., a diamond square pyramid indenter (Vickers indenter) with an angle between opposite surfaces that is 136 degrees is pushed in the bump 30 at a load speed of 0.0948 mN/sec. Next, a test force (P/mN) when the push-in depth (D/μm) of the Vickers indenter reaches 0.5 μm is substituted in the following formula.

$$DHV=3.8584P/D2=15.4336P$$

It is preferable that the height of the bump 30 should be equal to or larger than 5 μm and equal to or smaller than 80 μm, and more preferably, equal to or larger than 10 μm and equal to or smaller than 60 μm. When the height of the bump 30 is less than 5 μm, a short-circuit prevention effect between the conductor pattern 5 and the P-type semiconductor layer 26 of the light emitting element 22 or between the conductor pattern 5 and the N-type semiconductor layer 24 becomes insufficient. Conversely, when the height exceeds 80 μm, in a vacuum thermal pressing process in the manufacturing process of the light emitting module, the bump 30 may deform the light transmissive film 4. In this case, this results in a poor visual inspection result of the light emitting module 1, and a poor connection between the light emitting element 22 and the conductor pattern 5.

In addition, it is preferable that a contact area between the electrode 28, 29 of the light emitting element 22 and the bump 30 should be equal to or larger than 100 μm$^2$ and equal to or smaller than 15,000 μm$^2$, and more preferably, equal to or larger than 400 μm$^2$ and equal to or smaller than 8,000 μm$^2$. Each dimension is a measured value under a stable environment in which a room temperature and the temperature of the measurement sample are 20° C.±2° C.

Figure 4:
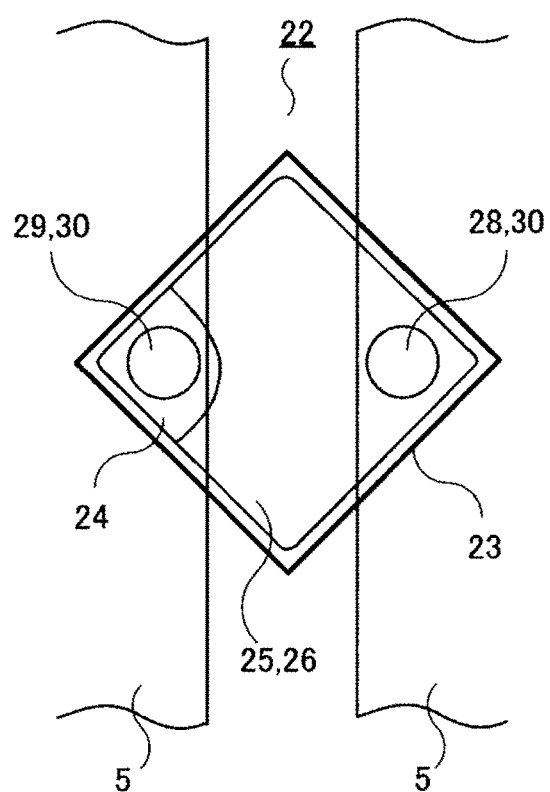
FIG. 4 is a diagram illustrating an example connection between a conductor pattern and the light emitting element.

FIG. 4 illustrates an example connection between the conductor pattern 5 and the light emitting element 22. The electrodes 28, 29 of the light emitting element 22 are connected to the respective adjoining pieces of the conductor pattern 5.

The pair of light transmissive films 4, 6, the resin layer 13, and the multiple light emitting elements 22 are integrated by vacuum thermal pressing. Hence, at least a part of the bump 30 is electrically connected to the electrode 28, 29 of the light emitting element 22 in an un-melted condition. Accordingly, a contact angle between the upper surface of the electrode 28, 29 and the bump 30 becomes, for example, equal to or smaller than 135 degrees.

The light emitting element 22 emits light by an applied DC voltage via the electrodes 28, 29. When, for example, the light emitting module 1 has two strings each including seven light emitting elements 22, the conductor pattern 5 of the light emitting module 1 forms a 7-series and 2-parallel circuit. The light emitting elements 22 connected in series have the current that has the same magnitude across the whole light emitting elements 22.

The light emitting element 22 of the light emitting module 1 employing the above structure has the bumps 30. Hence, even if the flexible light emitting module 1 in which the light emitting elements 22 are embedded is bent in such a way that the side at which the electrodes 28, 29 are formed is convexed, the bump 30 ensures the sufficient height, and thus a short-circuit between the conductor pattern 5 and the light emitting element 22 is preventable.

<Manufacturing Method>

Next, an explanation will be given of a manufacturing method of the light emitting module 1 in accordance with this embodiment.

First, the light emitting element 22 formed with the electrode 28 and the electrode 29 (anode electrode and cathode electrode or cathode electrode and anode electrode) is prepared.

Next, the bumps 30 are formed on the respective electrodes 28, 29 of the light emitting element 22. Hence, the light emitting element 22 formed with the respective bumps 30 on the electrodes 28, 29 as illustrated in FIG. 2 is finished. As for the formation scheme of the bump 30, a scheme of forming a gold or gold-alloy bump from an Au wire or an Au-alloy wire using a wire bump processing apparatus is applicable. It is preferable that the applied wire has a diameter of equal to or greater than 15 μm and equal to or smaller than 75 μm.

In accordance with this embodiment, a wire bonding apparatus is applied. By performing discharge at the tip of the wire, the wire tip is melted to form a ball, and the ball and the electrode 28, 29 are connected by ultrasound. Next, with the ball being connected to the electrode 28, 29, the ball is cut from the wire. Hence, as illustrated in FIG. 5, the bump 30 that has a protrusion left at the upper end is formed on the upper surface of the electrode 28, 29.

<Rounding Process>

The microscopic protrusion left at the upper end of the bump 30 may be left as it is, but a rounding process may be performed on the bump 30 when desired by depressing the upper surface of the bump 30.

Figure 5:
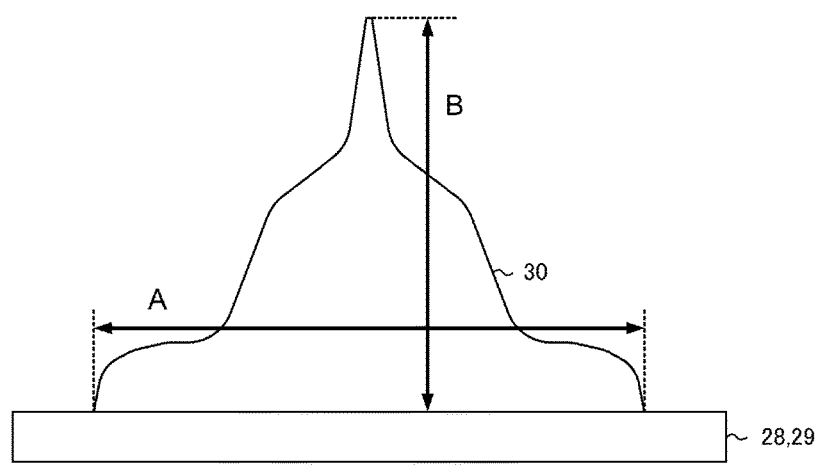
FIG. 5 is an exemplary diagram illustrating a bump prior to a rounding process.

As an example, as illustrated in FIG. 5, the protrusion formed when cut from the wire is left at the upper portion of the bump 30. This protrusion is called a tail. When the diameter of a surface in contact with the electrode 28, 29 is A, and the height of the bump 30 is B, it is desirable that the shape of the bump 30 should satisfy a condition that is B/A=0.2 to 0.7. Hence, when the shape of the bump 30 is out of this numerical value range, the rounding process is performed.

Figure 6A:
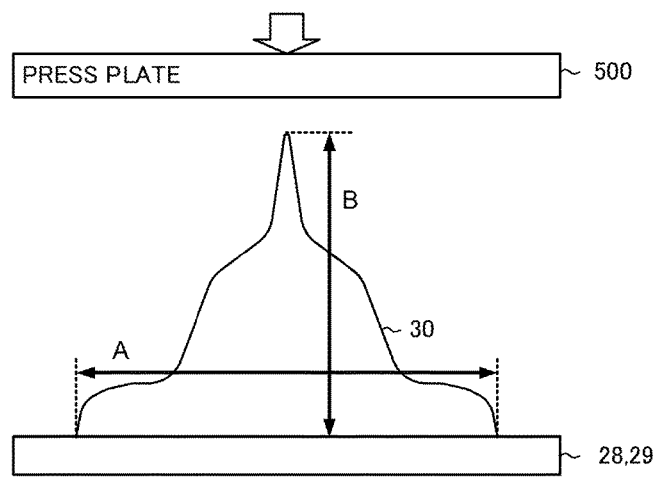
FIG. 6A is a diagram for explaining the rounding process by using a jig.
Figure 6B:
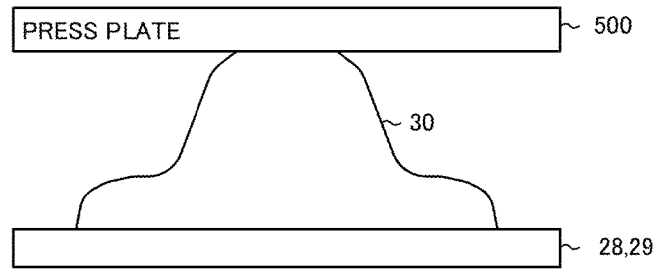
FIG. 6B is a diagram for explaining the rounding process by using the jig.
Figure 6C:
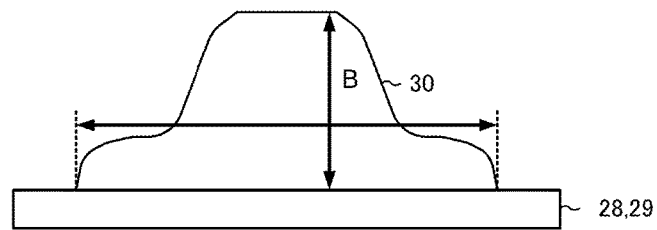
FIG. 6C is a diagram for explaining the rounding process by using the jig.

FIGS. 6A to 6C are each a diagram for explaining the rounding process using a press plate 500. After the bump 30 is formed, the light emitting element 22 is disposed on a bump bonding apparatus (unillustrated). Next, as illustrated in FIG. 6A, with the lower surface of the press plate 500 provided at the bump bonding apparatus being in parallel with the electrodes 28, 29, the press plate 500 is positioned on the space above the bump 30.

Subsequently, the press plate 500 is moved down, and as illustrated in FIG. 6B, the press plate 500 is depressed against the upper portion of the bump 30. At this time, the press plate 500 is moved down until the height of the bump becomes the desired height B. The tail of the bump 30 is crushed by the press plate 500. Hence, as illustrated in FIG. 6C, a sequential surface that has no protrusion at the upper portion of the bump 30 is formed. This sequential surface becomes flat at the upper end portion of the bump 30.

Figure 7A:
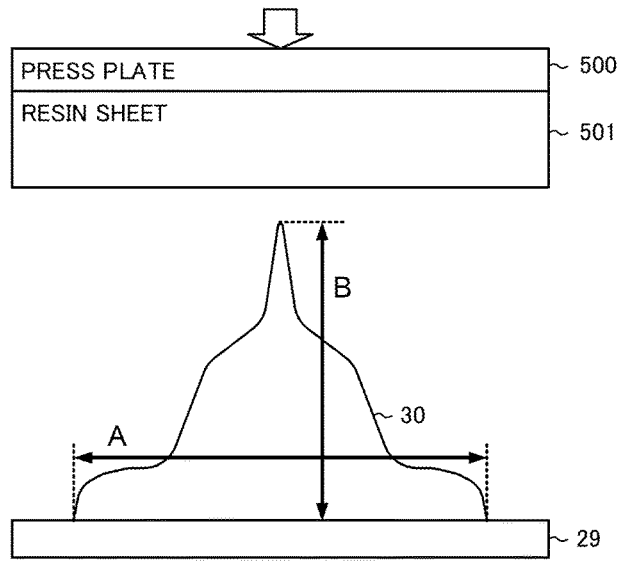
FIG. 7A is a diagram for explaining the rounding process by using a jig and a resin sheet.

The rounding process may be performed by pressing the bump 30 via a resin sheet. In this case, a resin sheet 501 formed of, for example, PET, a fluorine resin, TPX, or olefin is attached to the lower surface of the press plate 500. Next, as illustrated in FIG. 7A, with the lower surface of the press plate 500 on which the resin sheet 501 is disposed being in parallel with the electrodes 28, 29, the press plate 500 is positioned above the bump 30.

Figure 7B:
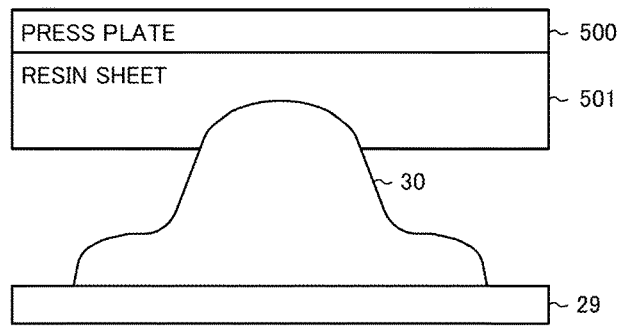
FIG. 7B is a diagram for explaining the rounding process by using the jig and the resin sheet.
Figure 7C:
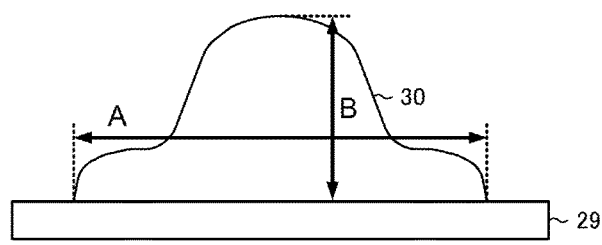
FIG. 7C is a diagram for explaining the rounding process by using the jig and the resin sheet.

Next, the press plate 500 is moved down, and as illustrated in FIG. 7B, the resin sheet 501 is pushed against the upper portion of the bump 30. In this case, the press plate 500 is moved down so as to accomplish the bump height that is the desirable height B. The tail of the bump 30 is crushed by the resin sheet 501. Hence, as illustrated in FIG. 7C, a sequential surface that has no protrusion at the upper portion of the bump 30 is formed. The sequential surface formed on the bump 30 by the rounding process using the resin sheet 501 becomes a convex curved surface upwardly at the upper end of the bump 30.

Figure 8A:
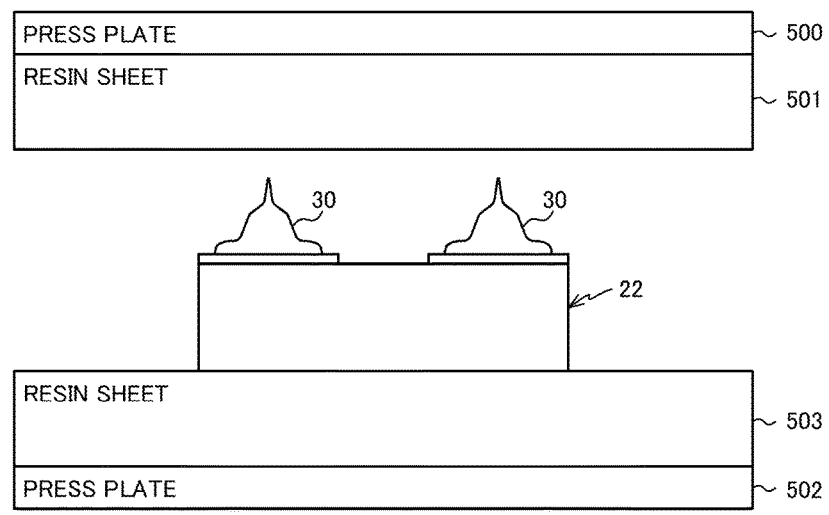
FIG. 8A is a diagram for explaining the rounding process by using a jig and a resin sheet.

In accordance with the rounding process using the resin sheet 501, for example, as illustrated in FIG. 8A, the press plate 500 to which the resin sheet 501 is attached is disposed above the light emitting element 22, while a press plate 502 to which a resin sheet 503 is attached is disposed below the light emitting element 22. Those resin sheets 501, 503 have a larger thickness than a value obtained by adding the thickness of the light emitting element 22 and the height B of the bump 30.

Figure 8B:
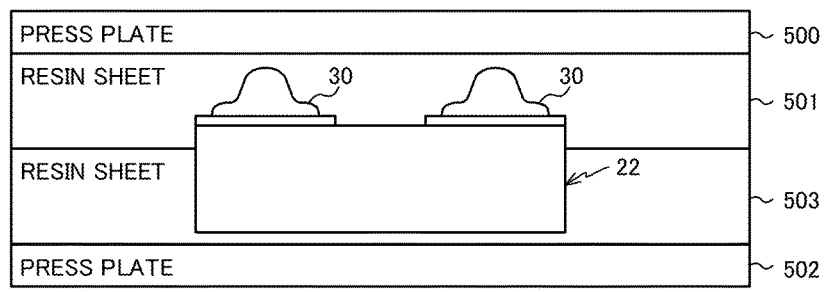
FIG. 8B is a diagram for explaining the rounding process by using the jig and the resin sheet.

Next, the press plate 500 is moved down, while the press plate 502 is moved up, thereby holding the light emitting element 22 therebetween to press the light emitting element 22. Hence, as illustrated in FIG. 8B, the light emitting element 22 becomes a condition embedded in the resin sheets 501, 503. At this time, the bump 30 of the light emitting element 22 is subjected to the rounding process, and thus the tail is crushed. The displacement amount of the press plates 500, 502 at the time of pressing is determined in accordance with the target height of the bump 30.

Next, the pressing to the light emitting element 22 is finished, and the resin sheets 501, 503 are removed from the light emitting element 22. Hence, the light emitting element 22 that has the bump 30 formed with the sequential surface that is a sequential curved surface is obtained. The light emitting element 22 may be disposed on the press plate 502 without the resin sheet 503, and the press work may be directly performed on this light emitting element 22.

As explained above, the bump 30 is formed on the upper surface of the light emitting element 22. The present disclosure is not limited to this scheme, and in addition to the formation of a wire bump using a wire bonder, for example, the bump 30 can be formed by electrolytic plating or non-electrolytic plating on the electrode 28, 29. In addition, the bump 30 can be formed by ink-jet printing of an ink containing metal particles on the electrode 28, 29, and by calcination. Still further, a paste containing metal particles may be printed or applied to the electrode 28, 29 to form the bump 30, and the bump 30 may be also formed on the electrode 28, 29 by technologies, such as ball mounting, pellet mounting, and vapor deposition sputtering. In addition, a material, such as a metal like gold, silver, copper, or nickel, an alloy like a tin-gold alloy, an eutectic material, an amorphous material, and solder is applicable for the bump 30.

Figure 9A:
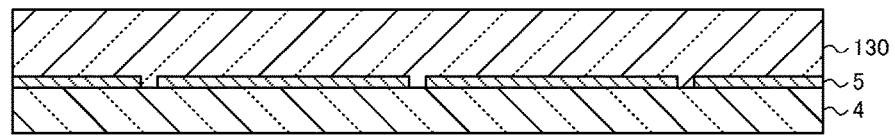
FIG. 9A is a diagram for explaining a light emitting module manufacturing method in accordance with the embodiment.

After the bump 30 is formed on the light emitting element 22, the light transmissive film 4 having the conductor pattern 5 formed on the upper surface is prepared. Next, as illustrated in FIG. 9A, the resin sheet 130 with a light transmissive property is disposed on the upper surface of the light transmissive film 4. The resin sheet 130 may be tentatively tacked to the light transmissive film 4 by an adhesive.

The resin sheet 130 mainly contains a resin that is thermosetting and has a light transmissive property for visible light. An example resin sheet 130 is a sheet formed of, for example, an epoxy-based resin. This resin sheet 130 is shaped in the substantially same shape as that of the light transmissive film 4.

It is preferable that the resin sheet 130 should have the lowest melt viscosity prior to curing which is within a range between 10 and 10000 Pa·s, and a temperature Mp within a range between 80 and 160° C. when the viscosity of the resin sheet 130 becomes the lowest melt viscosity. It is preferable that, when the resin sheet 130 is subjected to temperature rise from the room temperature to the temperature Mp, the melt viscosity change rate of the resin sheet 130 should be equal to or smaller than $1/1000$. It is preferable that the Vicat softening temperature of the resin sheet 130 after reaching the lowest melt viscosity by heating and cured should be within a range between 80 and 160° C. It is preferable that the tensile storage elastic modulus of the resin sheet 130 should be within a range between 0.01 to 1000 GPa at a temperature within a range between 0 to 100° C. It is preferable that the glass transition temperature of the resin sheet 130 should be 100 to 160° C.

It is appropriate if the resin sheet 130 has a thickness capable of sufficiently filling the space between the light transmissive films 4, 6 caused by disposing the light emitting element 22 therebetween. When the thickness (T) of the resin sheet 130 is made thinner than the height (H) of the light emitting element 22, the thickness of the resin sheet 130 may be determined based on the difference (H−T).

Figure 9B:
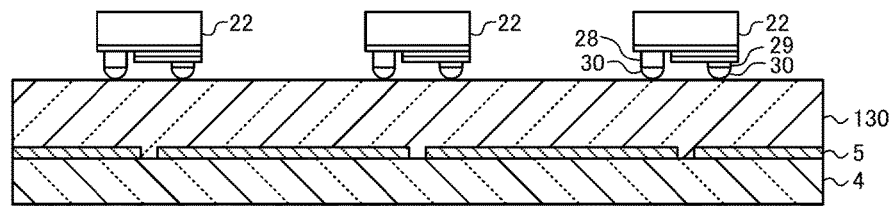
FIG. 9B is a diagram for explaining the light emitting module manufacturing method in accordance with the embodiment.

Next, as illustrated in FIG. 9B, the light emitting element 22 is disposed on the upper surface of the resin sheet 130. The light emitting element 22 is disposed in such a way that the surface on which the electrodes 28, 29 are formed faces the light transmissive film 4. In addition, the light emitting element 22 is positioned in such a way that the electrodes 28, 29 are located above the corresponding pieces of the conductor pattern 5.

Figure 9C:
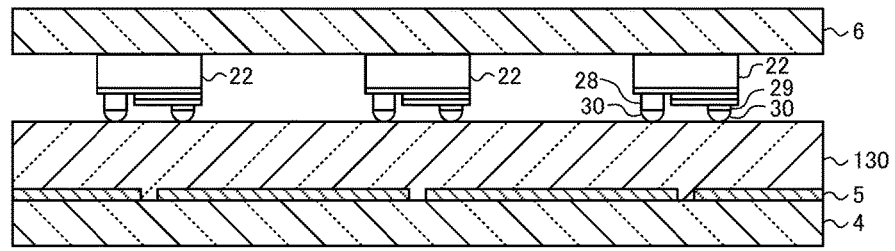
FIG. 9C is a diagram for explaining the light emitting module manufacturing method in accordance with the embodiment.

Subsequently, as illustrated in FIG. 9C, the light transmissive film 6 is disposed above the light emitting element 22.

Next, a laminated body that includes the light transmissive films 4, 6, the resin sheet 130, and the light emitting elements 22 is pressurized while being heated under a vacuum condition.

The heating and pressing process (vacuum thermal compression bonding process) under the vacuum atmosphere may be performed at two steps.

In the first step, the resin sheet 130 is pressurized and heated until reaching a temperature T1 (° C.). When the temperature at which the viscosity of the resin sheet 130 becomes the lowest melt viscosity is Mp (° C.), the temperature T1 is a temperature that satisfies the following conditional expression (1). It is preferable that the temperature T1 should satisfy a conditional expression (2).

$$Mp-50° C. \leq T1 < Mp \qquad (1)$$

$$Mp-30° C. \leq T1 < Mp \qquad (2)$$

In addition, $Mp-10° C. \leq T1 < Mp$ may be set.

In the second step, the resin sheet 130 is pressurized while being heated until reaching a temperature T2 (° C.). The temperature T2 is a temperature that satisfies the following conditional expression (3). It is preferable that the temperature T2 should satisfy a conditional expression (4).

$$Mp \leq T2 < Mp+50° C. \qquad (3)$$

$$Mp+10° C. \leq T2 < Mp+30° C. \qquad (4)$$

By adopting such a heating condition, the laminated body can be pressurized with the resin sheet 130 being softened as appropriate. In addition, the resin layer 13 can be formed by filling the softened resin sheet 130 in between the light transmissive film 4 and the light transmissive film 6 while connecting the electrodes 28, 29 of the light emitting element 22 disposed on the conductor pattern 5 via the resin sheet 130 to the predetermined pieces of the conductor pattern 5.

When the temperature T1 in the first step is less than a lower limit value that is Mp−50° C. indicated in the conditional expression (1), the softening of the resin sheet 130 becomes insufficient. Consequently, the intimate contact of the resin sheet 130 with the light emitting element 22 decreases, which may result in an insufficient connection between the corresponding pieces of the conductor pattern 5 and the electrodes 28, 29 of the light emitting element 22.

Conversely, when the temperature T1 in the first step is equal to or greater than an upper limit value that is Mp in the conditional expression (1), the resin sheet 130 is hardened. Consequently, the intimate contact of the resin sheet 130 with the light emitting element 22 decreases, which may result in an insufficient connection between the corresponding pieces of the conductor pattern 5 and the electrodes 28, 29 of the light emitting element 22.

When the temperature T2 in the second step is less than a lower limit value that is Mp indicated in the conditional expression (3), the curing of the resin sheet 130 becomes insufficient. Consequently, the intimate contact of the resin sheet 130 with the light emitting element 22 may decrease.

Conversely, when the temperature T2 in the second step is equal to or higher than an upper limit value that is Mp+50° C. indicated in the conditional expression (3), the light transmissive films 4, 6 are softened, which may result in a deformation of the entire laminated body.

<Thermal Compression Bonding Process>

It is preferable that the thermal compression bonding process for the laminated body under the vacuum atmosphere should be carried out as follow. The above laminated body is pre-pressurized so as to cause each component to be intimately in contact with each other. Next, a work space where the pre-pressurized laminated body is disposed is vacuumed until the vacuum degree of 5 kPa is accomplished, and the laminated body is pressurized while being heated to the above temperature. By performing thermal compression bonding on the pre-pressurized laminated body under the vacuum atmosphere as explained above, as illustrated in FIG. 9D, the softened resin sheet 130 can be filled in the space between the light transmissive film 4 and the light transmissive film 6 without a void.

It is preferable that the vacuum atmosphere at the time of thermal compression bonding should be equal to or lower than 5 kPa. The pre-pressurizing process to pre-pressurize the laminated body may be omitted, but in this case, a positional displacement of the laminated body, etc., is likely to occur. Hence, it is preferable to perform pre-pressurization.

When the thermal compression bonding on the laminated body is performed under an ambient atmosphere or in a low vacuum condition, air bubbles are likely to be left within the light emitting module 1 having undergone the thermal compression bonding, in particular, around the light emitting element 22. Air trapped in the left air bubbles within the light emitting module 1 is pressurized. This may cause an expansion of the light emitting module 1 after the thermal compression bonding, and a peeling between the light emitting element 22 and the light transmissive films 4, 6. In addition, when air bubbles and an expansion are present in the light emitting module 1, in particular, near the light emitting element 22, light will be scattered non-uniformly, resulting in a poor visual inspection result of the light emitting module 1.

As explained above, with the resin sheet 130 being present between the conductor pattern 5 and the electrodes 28, 29 of the light emitting element 22, by performing the thermal compression bonding process, the resin layer 13 can be formed around the light emitting element 22 while electrically connecting the electrodes 28, 29 with the corresponding pieces of the conductor pattern 5. In addition, a part of the resin layer 13 can be filled excellently in the space between the upper surface of the light emitting element 22 and the conductor pattern 5.

By performing the above thermal compression bonding on the laminated body, the finished light emitting module 1 illustrated in FIG. 1 is obtained. In accordance with the manufacturing method in this embodiment, the light emitting module 1 that has improved electrical connection between the corresponding pieces of the conductor pattern 5 and the electrodes 28, 29 of the light emitting element 22, and reliability thereof is manufactured with an excellent reproducibility. Although the processes in FIGS. 9A to 9D advance with the light emitting element 22 being directed downwardly, the processes may advance with the light emitting element 22 being directed upwardly.

In accordance with this embodiment, the explanation has been given of an example case in which the resin layer 13 is formed using the single resin sheet 130, but the resin layer 13 may be formed using multiple (e.g., two) resin sheets.

Figure 10A:
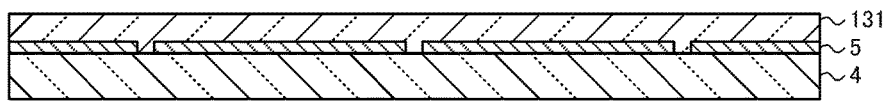
FIG. 10A is a diagram for explaining a light emitting module manufacturing method in accordance with a modified example.

More specifically, as illustrated in FIG. 10A, a thermosetting resin sheet 131 is disposed on the upper surface of the light transmissive film 4 so as to cover the conductor pattern 5. This resin sheet 131 is formed of the same material as that of the resin sheet 130. In addition, the thickness of the resin sheet 131 is substantially equivalent to a total of the height of the bump 30 on the light emitting element 22 and the height of the electrode 28, 29.

Figure 10B:
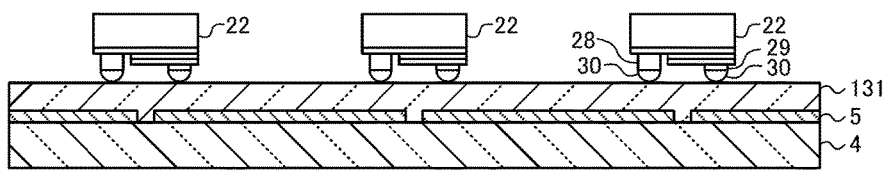
FIG. 10B is a diagram for explaining a light emitting module manufacturing method in accordance with the modified example.

Next, as illustrated in FIG. 10B, the multiple light emitting elements 22 are disposed on the upper surface of the resin sheet 131. The light emitting element 22 is disposed in such a way that the electrodes 28, 29 face the resin sheet 131.

Figure 10C:
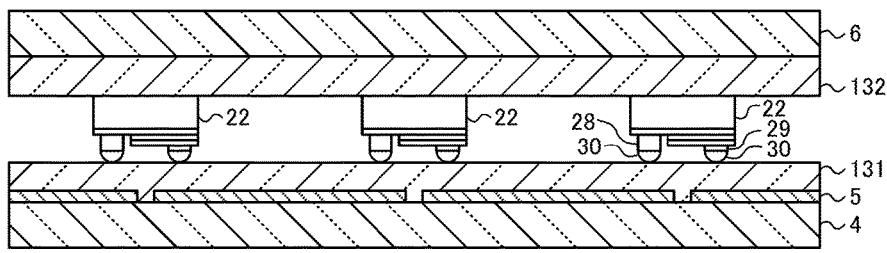
FIG. 10C is a diagram for explaining a light emitting module manufacturing method in accordance with the modified example.

Next, as illustrated in FIG. 10C, a thermosetting resin sheet 132 and the light transmissive film 6 are disposed on the light emitting element 22. This resin sheet 132 is also formed of the same material as that of the resin sheet 130.

Figure 10D:
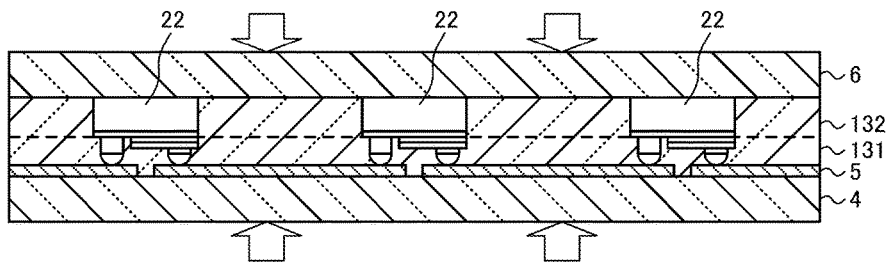
FIG. 10D is a diagram for explaining a light emitting module manufacturing method in accordance with the modified example.

Subsequently, as illustrated in FIG. 10D, the laminated body that includes the light transmissive films 4, 6, the resin sheets 131, 132, and the light emitting elements 22 is pressurized while being heated under a vacuum atmosphere. The light emitting module 1 can be manufactured through the above steps. In accordance with this light emitting module 1, the resin layer 13 is formed by a first resin layer formed of the resin sheet 131, and a second resin layer formed of the resin sheet 132.

In this case, the light transmissive film 6 may be utilized as a tentative base body, the entire laminated body may be pressurized to electrically connect the electrodes 28, 29 of the light emitting element 22 with the corresponding pieces of the conductor pattern 5, and the light transmissive film 6 and the resin sheet 132 may be peeled. Next, a resin sheet and an eventual light transmissive film which have the same thicknesses as those of the peeled ones may be pasted to manufacture the light emitting module 1.

More specifically, the light transmissive film 6 and the resin sheet 132 are removed from the laminated body that includes the integrated light transmissive films 4, 6, resin sheets 131, 132, and light emitting elements 22. Next, the replacements of the removed light transmissive film 6 and resin sheet 132 may be pasted on the surface of the resin sheet 131.

An example resin sheet also applicable to form the resin layer 13 is a thermoplastic resin. An example thermoplastic resin is thermoplastic elastomer. Elastomer is an elastic material that is a polymer material. Example known elastomers are acrylic-based elastomer, olefin-based elastomer, styrene-based elastomer, ester-based elastomer, and urethane-based elastomer.

It is preferable that the above thermoplastic resin should have a Vicat softening temperature within a range between 80 to 160° C., and the tensile storage elastic modulus within a range between 0.01 to 10 GPa at a temperature of 0 to 100° C. It is preferable that the thermoplastic resin should not be melted at the Vicat softening temperature, and have the tensile storage elastic modulus which is equal to or greater than 0.1 MPa at the Vicat softening temperature. It is preferable that the thermoplastic resin should have a melting-point temperature which is equal to or higher than 180° C., or a melting-point temperature higher than the Vicat softening temperature by equal to or higher than 40° C. It is preferable that the thermoplastic resin should have a glass transition temperature which is equal to or lower than −20° C. when applied to form the resin layer 13.

When the resin layer 13 is formed by the thermosetting resin sheet and the thermoplastic resin sheet, first, the light emitting elements 22 are held between the thermosetting resin sheet and the thermoplastic resin sheet. Next, the thermosetting resin sheet, the thermoplastic resin sheet, and the light emitting elements 22 are held between the light transmissive films 4, 6, and the laminated body as illustrated in FIG. 10D is formed. Subsequently, this laminated body is pressurized and heated. This accomplishes an electrical connection of the conductor pattern 5 with the light emitting element 22, thermal curing of the thermosetting resin sheet, and filling of the thermoplastic resin sheet in the space between the upper surface of the light emitting element 22 and the light transmissive film 4.

The electrical connection of the conductor pattern 5 with the light emitting element 22, the thermal curing of the thermosetting resin, and the filling of the thermoplastic resin may be carried out at individual pressurization and heating processes. In this case, either one of the electrical connection of the conductor pattern 5 with the light emitting element 22 or the thermal curing of the thermosetting resin sheet may be simultaneously performed with the heating process for filling the thermoplastic resin in the concavity and convexity.

Alternatively, after the electrical connection of the conductor pattern 5 with the light emitting element 22 by the thermosetting resin and the thermal curing of the thermosetting resin are performed at the respective appropriate temperatures by the pressurization and heating process, the thermoplastic resin may be stacked. Next, this thermoplastic resin may be pressurized and heated to fill the thermoplastic resin in the concavity and convexity that are formed between the thermosetting resin and the light emitting element 22.

When the pressurization and heating process (vacuum thermal compression bonding process) under a vacuum atmosphere is to be performed on the thermoplastic resin, first, with the thermoplastic resin being heated so as to be a temperature T within a range that is, for example, Mp−10 (° C.)≤T≤Mp+30 (° C.) where Mp is the Vicat softening temperature of the thermoplastic resin, the laminated body may be pressurized. In addition, the temperature T may be within a range that is Mp−10 (° C.)≤T≤Mp+10 (° C.). Either the electrical connection of the conductor pattern 5 with the light emitting element 22 by the thermosetting resin or the thermal curing of the thermosetting resin may be performed simultaneously with the heating on the thermosetting resin, or may be performed individually as explained above.

This embodiment also covers the following aspects.

1) [When Thermosetting Resin Sheet is Single Layer]

In this case, the start material includes the light transmissive film 4, the conductor pattern 5, the resin sheet 130 formed of the thermosetting resin, the light emitting elements 22, and the light transmissive film 6. The light emitting module is formed through the following processes. The laminated body that includes the light transmissive film 4, the conductor pattern 5, the resin sheet 130, and the light emitting elements 22 is subjected to a first pressurization and heating process to embed the light emitting elements 22 in the resin sheet 130, and to connect the light emitting elements 22 with the conductor pattern 5. Next, this laminated body is subjected to a second pressurization and heating process to perform thermal curing on the resin sheet 130.

2) [When Thermosetting Resin Sheet is Two Layers]

In this case, the start material includes the light transmissive film 4, the conductor pattern 5, the resin sheet 131 formed of the thermosetting resin, and the light emitting elements 22. The light emitting module is formed through the following processes. The laminated body that includes the light transmissive film 4, the conductor pattern 5, the resin sheet 131, and the light emitting elements 22 is subjected to a first pressurization and heating process to electrically connect the light emitting element 22 with the conductor pattern 5 by the bump 30 that passes completely through the resin sheet 131. Next, the laminated body is subjected to a second pressurization and heating process to perform thermal curing on the resin sheet 131. Subsequently, the resin sheet 132 formed of the thermosetting resin and the light transmissive film 6 are laminated in sequence on the laminated body. Next, the laminated body is subjected to a third pressurization and heating process to fill the resin sheet 132 formed of the thermosetting resin into the concavity and convexity of the base surface. Subsequently, the laminated body is subjected to a fourth pressurization and heating process to cure the resin sheet 132.

3) [When Thermosetting Resin Sheet and Thermoplastic Resin Sheet are Applied (Laminated Film)]

The start material includes the light transmissive film 4, the conductor pattern 5, the resin sheet 131 formed of the thermosetting resin, and the light emitting elements 22. The light emitting module is formed through the following processes. The laminated body that includes the light transmissive film 4, the conductor pattern 5, the resin sheet 131, and the light emitting elements 22 is subjected to a first pressurization and heating process to electrically connect the light emitting element 22 with the conductor pattern 5 by the bump 30 that passes completely through the resin sheet 131. Next, the laminated body is subjected to a second pressurization and heating process to perform thermal curing on the resin sheet 131. Subsequently, the resin sheet 132 formed of a thermoplastic resin and the light transmissive film 6 are laminated in sequence on the laminated body. Next, the laminated body is subjected to a third pressurization and heating process to fill the resin sheet 132 formed of the thermoplastic resin into the concavity and convexity of the base surface.

In addition, the following structure is also employable if desirable.

For example, the start material includes the light transmissive film 4, the conductor pattern 5, the resin sheet 131 formed of the thermoplastic resin, and the light emitting modules 22. The light emitting module is formed through the following processes. The laminated body that includes the light transmissive film 4, the conductor pattern 5, the thermoplastic resin sheet 131, and the light emitting elements 22 is subjected to a first pressurization and heating process to electrically connect the light emitting element 22 with the conductor pattern 5 by the bump 30 that passes completely through the thermoplastic resin sheet 131. Next, the resin sheet 132 formed of the thermosetting resin, and the light transmissive film 6 are laminated in sequence on the laminated body. Subsequently, the laminated body is subjected to a second pressurization and heating process to fill the resin sheet 132 formed of the thermosetting resin into the concavity and convexity of the base surface. When desired, the laminated body is subjected to a third pressurization and heating process to thermally cure the resin sheet 132 formed of the thermosetting resin.

Note that in the above embodiment, as illustrated in FIG. 2, the applied light emitting element 22 has the two electrodes on the one surface. However, a light emitting element (double-sided-electrode light emitting element) that has the respective electrodes on the upper surface and the lower surface is also applicable. In addition, the light emitting module 1 may include both the light emitting element 22 that has the two electrodes on the one surface, and the double-sided-electrode light emitting element. When the double-sided-electrode light emitting element is applied, the conductor circuitry layers are provided at both the light transmissive films 4, 6. In accordance with the double-sided-electrode light emitting element, the bump is provided at the light-emitting-surface side of the light emitting element.

In the above embodiment, as illustrated in FIG. 2, the explanation has been given of an example case in which the electrodes 28, 29 (pad electrodes) of the light emitting element 22 that has the two electrodes on the one surface have different thicknesses. The present disclosure is not limited to this example case, and for example, the surface heights of the bumps 30 can be aligned by having the electrodes 28, 29 that have the same thickness, and by changing the diameter of the bump 30 between both the electrodes.

When the electrodes 28, 29 have the same thickness, and the respective bumps 30 have the same diameter, the top of the bump 30 on the electrode 29 is lower than the top of the bump 30 on the electrode 28. In this case, when the light emitting element 22 is pushed in until the lower bump 30 reaches the conductor pattern 5 by the compression at the time of pressurization and heating, a connection between the bump 30 and the conductor pattern 5 is obtained. This process can be performed in both the case in which the connection between the bump 30 and the conductor pattern 5 is to be obtained using the thermosetting resin sheet and the case in which the connection between the bump 30 and the conductor pattern 5 is to be obtained using the thermoplastic resin.

In the above embodiment, as illustrated in, for example, FIG. 9C or 10C, the explanation has been given of an example case in which, by integrally pressurizing the laminated body that includes the light transmissive films 4, 6, the resin sheets 130, 131, 132, and the light emitting elements 22, the electrical connection between the bump 30 of the light emitting element 22 and the conductor pattern 5 of the light transmissive film 4 is obtained. Various modifications can be made to the manufacturing process of the light emitting module 1.

Figure 11:
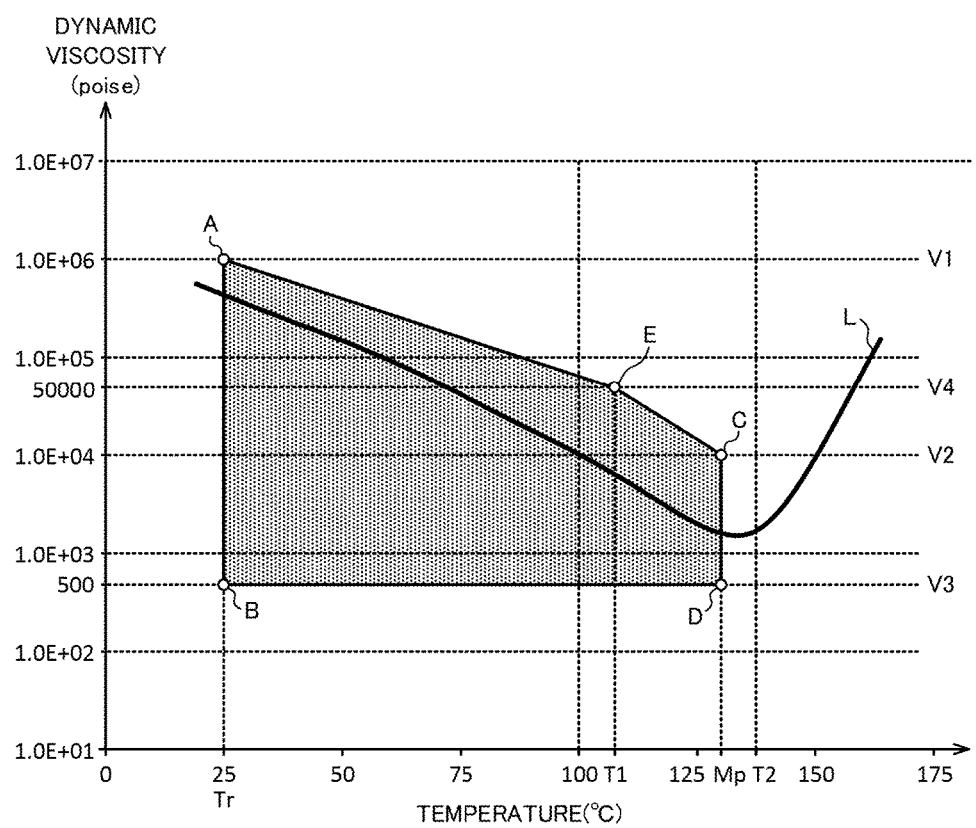
FIG. 11 is a diagram illustrating a dynamic viscosity of the resin sheet prior to a thermal curing process.

FIG. 11 illustrates a dynamic viscosity ($\eta^*$) of the resin sheet prior to thermal curing. The viscoelastic curved line of the thermosetting resin sheet prior to the thermal curing is indicated as L, and the temperature of the thermosetting resin sheet at the lowest melt viscosity, i.e., the maximum softening temperature (cured temperature) is indicated as Mp.

The maximum softening temperature Mp can take the value that is 80 to 160° C. or 80 to 150° C. The upper limit is defined by, for example, the maximum softening temperature of a PET film which is 180° C. A more preferable range of the maximum softening temperature Mp is within a range between 100 to 130° C. This is because the resin characteristics (the lowest melt viscosity, intimate contact, etc.) can be easily controlled. In FIG. 11, T1 indicates the pressurization and heating temperature when an LED chip that has two electrodes on the one surface is mounted on a light transmissive film formed with a conductor pattern via a thermosetting resin sheet and is thermally pressed. T2 indicates the thermal curing process temperature when the temperature is increased after the light emitting element 22 is electrically connected to the conductor pattern, and thermal curing is performed on the thermosetting resin.

In FIG. 11, each point A to E indicates the following condition.

[Point A]: the upper limit point enabling a disposition of an LED (tentative tacking viscosity or tentative tacking upper limit viscosity). This is the upper limit point at which the disposed light emitting element (LED) is prevented from being detached or from being displaced displaced since the viscosity of the resin is too high (i.e., the resin is too hard) and the tacking is not excellent after the LED is disposed (mounted) at a prescribed position (the position of the connection pad of the conductor pattern), and when the process transitions to the subsequent process. That is, this is a chip mounting upper limit viscosity.

[Point C]: the upper limit point enabling the LED to be embedded (packaging viscosity or packaging upper limit viscosity). This is the upper limit point at which the resin is sufficiently filled around the LED in the vacuum thermal compression bonding process to embed the LED. That is, the filling control upper limit viscosity.

[Point D]: the lower limit value enabling a flow control (fluidization preventive viscosity or fluidization preventive lower limit viscosity). In a vacuum thermal compression bonding process of embedding an LED, when the viscosity of the resin is low, pressure produces a flow when the temperature is increased to the curing temperature, the fluidized resin displaces the position of the light emitting element (LED), and in an extremely case, a liquefaction of the resin occurs, and the necessary resin is flown out from the film external contour end (in this case, the necessary resin thickness for the device structure cannot be ensured). That is, this is the lower limit viscosity for a flow control.

[Point E]: the upper limit point enabling an electrical connection with the LED (pressurization connection upper limit viscosity). This is an upper limit viscosity enabling the bump of the LED to reach the conductor pattern and to obtain a connection between the LED and the conductor pattern at the time of thermal pressing. In general, this is a thermal press connection upper limit viscosity.

[Point B]: the lower limit viscosity that covers the above restrictions at A, C, D, and E. That is, the same viscosity as that of the point D.

In FIG. 11, the points A and B are located at a room temperature Tr, i.e., at a normal temperature (25° C.), while the points C and D are located at the maximum softening temperature Mp. In addition, the point E is located at a thermal press temperature T1 enabling the bump of the LED to pass completely through the resin and to obtain a connection with the conductor pattern.

In FIG. 11, based on the knowledges by the inventor of the present disclosure, the points C and D define a gate over the process. That is, when the laminated body is subjected to thermal curing at the temperature T2 after being subjected to thermal pressing at the temperature T1, various cases, such as a case in which no pressurization is performed at the maximum softening temperature Mp, a case in which the pressurization is continuously performed, and a case in which the pressurization is performed while the pressurization level is decreased, are available. Hence, as for the process designing, it is necessary that the resin is not fluidized at the point D under the pressurization.

In addition, when the temperature transitions from T1 to T2, it is necessary that the resin is soft to some level at the maximum softening temperature Mp. Hence, it is necessary that the viscoelastic characteristic of the resin should be within a range between C to D at the maximum softening temperature.

Still further, it is necessary that the viscoelastic characteristic of the resin should be within the range between A and B at the room temperature Tr, and should be equal to or lower than E at the thermal press temperature T1. That is, in view of the process designing, it is preferable that the viscoelastic characteristic curved line of the resin should be within a region defined by interconnecting A, B, C, and D or A, B, C, D, and E by straight lines (i.e., A-B-D-C-A or A-B-D-C-E-A). Note that the thermal pressing for obtaining an electrical connection with the LED may be performed at the viscosity that is equal to or lower than E and equal to or higher than B, D at the temperature T1 in principle.

As for actual values, the dynamic viscosity at each point is as follow.

A: 1,000,000 poise (V1)
C: 10,000 poise (V2)
D: 500 poise (V3)
E: 50,000 poise (V4)
B: 500 poise In addition, based on the above conditions, the region between C and D becomes 500 to 10,000 poise, but 2,000 to 5,000 poise is more preferable for the region between C and D which facilitates a flow control, and which enables an LED to be embedded at low pressure.

When the sealing viscosity is not requisite, the gate at the maximum softening temperature of the thermosetting resin becomes A to F because of the point F over the maximum softening temperature Mp which has the same viscosity as that of the point E. Hence, the region is defined by ABFD or ABEFD.

FIGS. 12A to 12D illustrates an example manufacturing method of the light emitting module 1 applied for measurement. However, the following measurement is common to the above various embodiments, such that the LED is held between the two thermosetting resin sheets and thermally pressed, the LED is embedded in a thick thermosetting resin sheet, and an electrical connection with the LED is obtained by the thermosetting resin sheet that is thinner than the LED, and the remaining is embedded by the thermoplastic resin sheet. An explanation will be below given of an example manufacturing process as illustrated in FIGS. 12A to 12D.

Figure 12A:
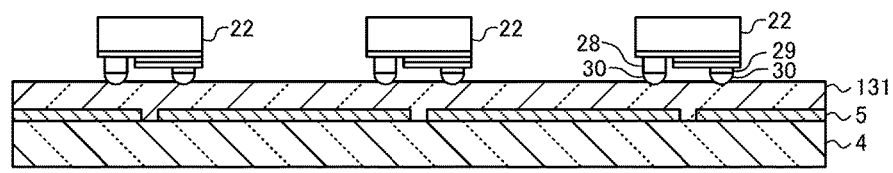
FIG. 12A is a diagram for explaining a light emitting module manufacturing method in accordance with a modified example.
Figure 12B:
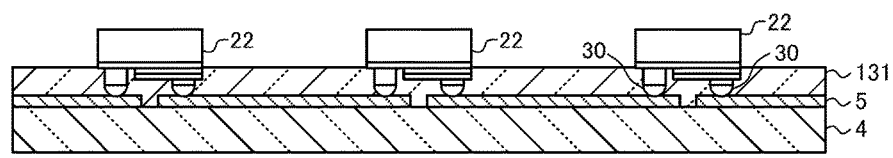
FIG. 12B is a diagram for explaining a light emitting module manufacturing method in accordance with the modified example.

First, as illustrated in FIG. 12A, the light emitting element 22 is disposed on the upper surface of the resin sheet 131 (thermosetting resin sheet) which is stacked on the light transmissive film 4, and which has a thickness of substantially 60 μm. Next, prior to disposing the light transmissive film on the light emitting element 22, initially, the light emitting element 22 is subjected to vacuum thermal compression bonding (thermal pressing) to the conductor pattern 5 at the vacuum degree of, for example, 5 kPa. Hence, as illustrated in FIG. 12B, the bump 30 of the light emitting element 22 passes completely through the resin sheet 131, and reaches the conductor pattern 5. Accordingly, the bump 30 is electrically connected to the corresponding piece of the conductor pattern 5.

When, for example, the lowest melt viscosity of the resin sheet is 3000 poise, and the temperature Mp at which the resin sheet is cured is 130° C., in the above thermal compression bonding, the resin sheet is heated to substantially 100° C., and the pressure of 0.2 MPa is applied to the light emitting element 22 (LED).

Figure 12C:
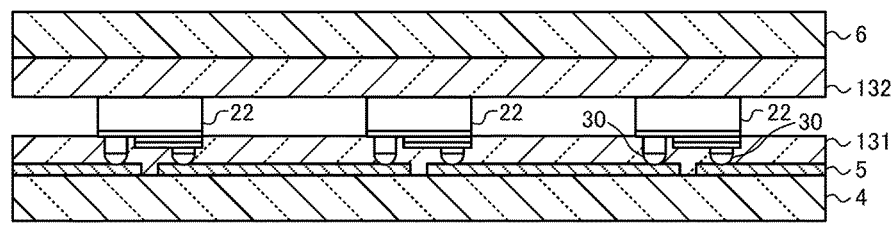
FIG. 12C is a diagram for explaining a light emitting module manufacturing method in accordance with the modified example.
Figure 12D:
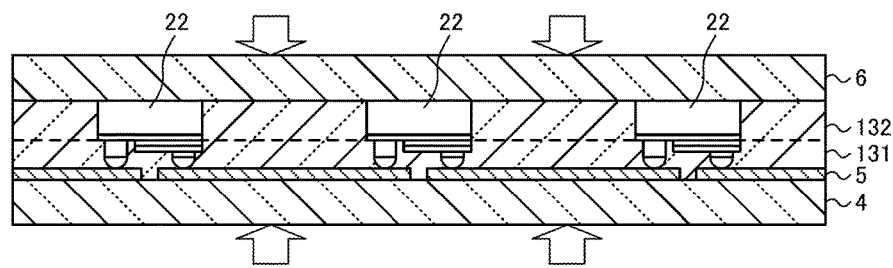
FIG. 12D is a diagram for explaining a light emitting module manufacturing method in accordance with the modified example.

Next, as illustrated in FIG. 12C, disposed on the light emitting element 22 are the resin sheet 132 which is thermosetting, and which has a thickness of substantially 60 μm, and the light transmissive film 6. Subsequently, as illustrated in FIG. 12D, the laminated body that includes the light transmissive films 4, 6, the resin sheets 131, 132, and the light emitting elements 22 is pressurized while being heated under the vacuum atmosphere.

When, for example, the lowest melt viscosity of the resin sheet is 3000 poise, and the temperature Mp at which the resin sheet is cured is 130° C., in the above thermal compression bonding, the laminated body is heated to 140° C., and the pressure of 0.2 MPa is applied to the laminated body.

Through the above processes, the light emitting module 1 is manufactured.

Figure 13:
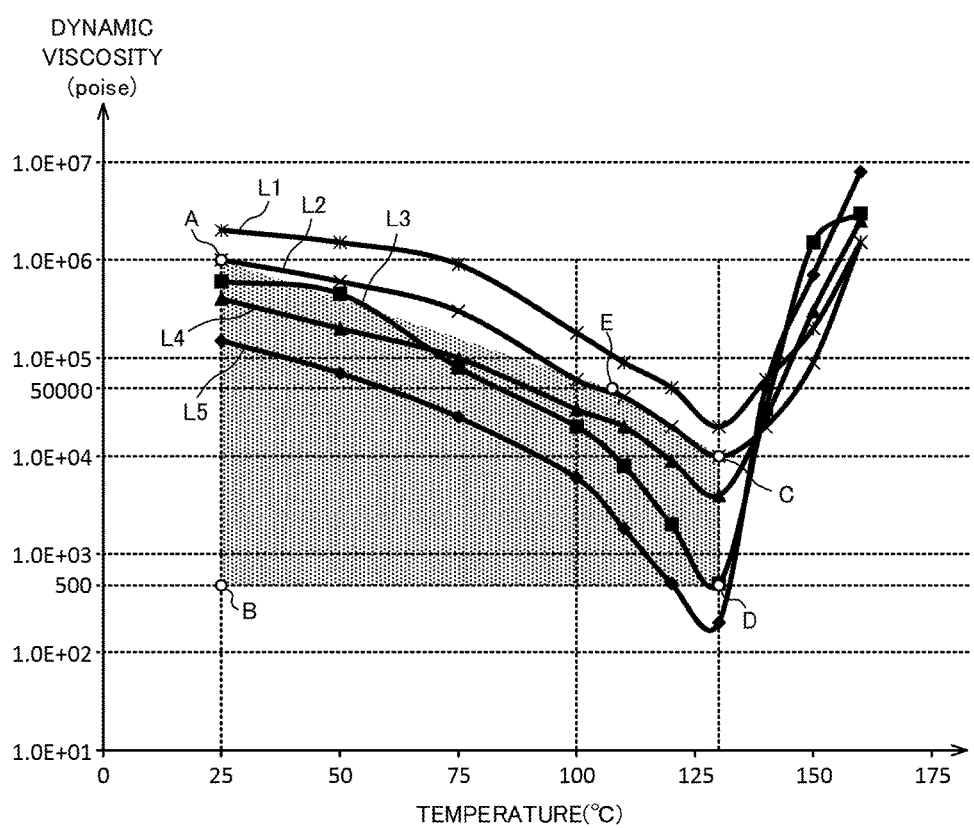
FIG. 13 is a diagram illustrating a dynamic viscosity of the resin sheet prior to the thermal curing process.

FIG. 13 is a diagram illustrating initial states of the resin sheets 130 to 132 which are thermosetting, i.e., the dynamic viscosity prior to thermal curing. The horizontal axis of the graph in FIG. 13 indicates a temperature (° C.), while the vertical axis indicates a dynamic viscosity (poise). Each curved line L1 to L5 indicates a viscoelastic characteristic of the resin sheet prior to thermal curing. The dynamic viscosity is obtainable by dynamic viscoelastic measurement. The dynamic viscoelastic measurement indicates the stress to the resin sheet when a constant cyclic sinusoidal wave strain is applied to the resin sheet. In general, the greater the dynamic viscosity is, the harder the material is, and the smaller the dynamic viscosity is, the softer the material is.

As illustrated in, for example, FIG. 12A, it is preferable that the resin sheet should be soft to some level when the light emitting elements 22 are disposed thereon. More specifically, when, for example, using an apparatus like a mounter, the light emitting element 22 is disposed on the resin sheet, it is preferable that the resin sheet should be soft to a level that enables the bump 30 of the light emitting element 22 to be slightly embedded in the resin sheet. When the resin sheet is soft to some level, the light emitting element 22 disposed by the mounter is tentatively tacked on the resin sheet. Hence, when the light transmissive film 4 on which the light emitting element 22 is already disposed is moved, and when the light transmissive film 6 is stacked on the light transmissive film 4, the light emitting element 22 is not displaced relative to the resin sheet, and thus the light emitting element 22 is precisely positioned.

In general, the mounting of the light emitting element 22 by the mounter is carried out at a room temperature, and thus when, for example, the resin sheet is 25° C., it is preferable that the dynamic viscosity of the resin sheet should be equal to or lower than 1.0 E×06 poise below the dashed line passing through the point A.

The thermal compression bonding on the laminated body that includes the light transmissive films, the resin sheets, the light emitting elements, etc., are carried out at a lower temperature than the temperature at which the resin sheet becomes the lowest melt viscosity, i.e., a lower temperature than the temperature Mp at which resin sheet starts curing. Next, the laminated body having undergone the thermal compression bonding is maintained in the pressurized condition until becoming the temperature Mp at which the resin sheet starts curing if desirable. Hence, when the dynamic viscosity is too small, the resin sheet may flow out from between the light transmissive films, and the position of the light emitting element 22 may be displaced together with the flowing resin. Accordingly, it is preferable that the dynamic viscosity of the resin sheet should be equal to or higher than 500 poise above the dashed line passing through the point D. That is, it is preferable that the minimum dynamic viscosity of the resin sheet should be equal to or greater than 500 poise.

When, for example, the light transmissive films 4, 6 are formed of PET that has a thickness of substantially 100 μm, it is preferable that the temperature Mp should be lower than the softening temperature of PET. Since the softening temperature of PET is substantially 180° C., the temperature Mp becomes, for example, 80 to 160° C. More preferably, the temperature Mp is 80 to 150° C., and roughly 100 to 130° C. Accordingly, when the temperature is 130° C., it is preferable that the dynamic viscosity should be equal to or higher than 500 poise.

Figure 9D:
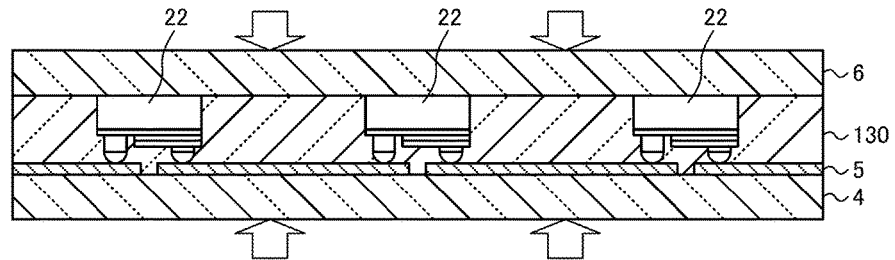
FIG. 9D is a diagram for explaining the light emitting module manufacturing method in accordance with the embodiment.

While the thermal compression bonding is being performed on the laminated body that includes the light transmissive films, the resin sheets, and the light emitting elements, etc., as illustrated in, for example, FIG. 9D, FIG. 10D, and FIG. 12D, it is necessary to cause the resin sheet to go around the light emitting element 22 without a void. Hence, the resin sheet should be softened to some level at the temperature Mp. Accordingly, it is preferable that the dynamic viscosity of the resin sheet should be equal to or lower than 1.0 E×04 poise below the dashed line passing through the point C at the temperature Mp. Hence, it is preferable that the dynamic viscosity should be equal to or lower than 1.0 E×04 poise at the temperature 130° C.

In this embodiment, by performing thermal compression bonding on the laminated body, the bumps 30 of the light emitting element 22 pass completely through the resin sheet, and reach the conductor pattern of the light transmissive film. Hence, when the laminated body is subjected to thermal compression bonding, it is necessary that the resin sheet should be softened to some level. After the thermal compression bonding starts, and until the desired pressure is applied to the laminated body, the laminated body is heated to substantially 100 to 110° C. Hence, it is preferable that the dynamic viscosity of the resin sheet should be equal to or lower than 50000 poise below the dashed line passing through the point E at the temperature of substantially 110° C.

In view of the foregoing, it is preferable that the resin layer 13 of the light emitting module 1 should be formed using a resin sheet which has the dynamic viscoelastic characteristic which is indicated by a curved line within the region defined by straight lines interconnecting the points A, B, C, D, and E in FIG. 13 that shows the transition of dynamic viscosity from substantially 25° C. to substantially 130° C.

For example, in the example case illustrated in FIG. 13, it is preferable to form the resin layer 13 of the light emitting module 1 using the resin sheet that has the dynamic viscoelastic characteristics indicated by curved lines L3, and L4. In addition, the resin sheet that has the dynamic viscoelastic characteristic indicated by a curved line L2 is also applicable. This is because the resin sheet that has the dynamic viscoelastic characteristic indicated by the curved line L2 satisfies the necessary dynamic viscosity condition upon formation of the resin layer at the points A to E.

Figure 14:
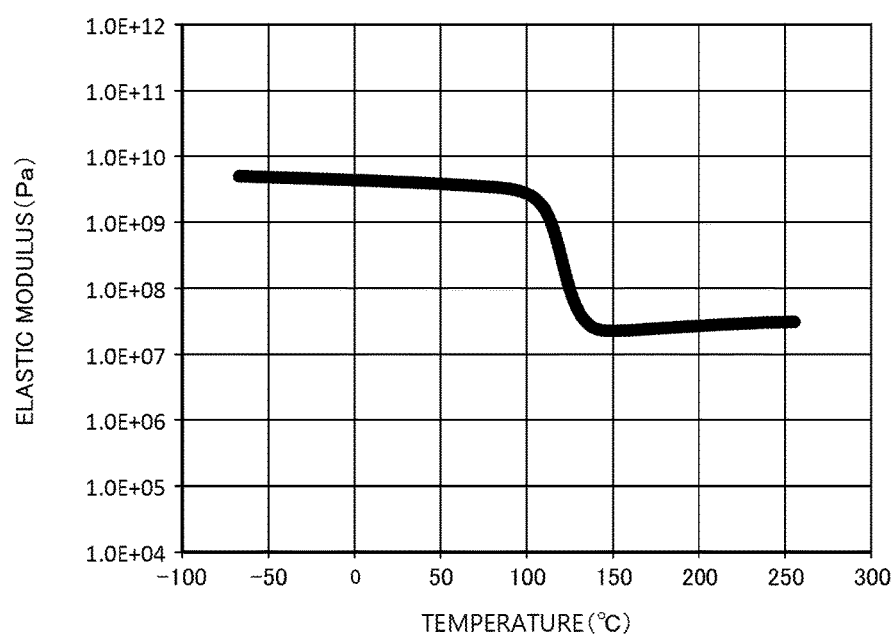
FIG. 14 is a diagram illustrating an elastic modulus of the resin sheet after the thermal curing process.

FIG. 14 is a diagram illustrating the tensile storage elastic modulus when the above resin sheet 130, 131, etc., is cured. As illustrated in FIG. 14, the resin sheet that has the dynamic viscoelastic characteristics indicated by L2 and L3 in FIG. 13 shows a characteristic that has a constant and stable tensile elastic modulus from the temperature lower than the normal temperature to 100° C. after cured. In addition, when heated beyond the softening temperature, the viscosity once keenly decreases, but then becomes the stable characteristic that has the constant tensile storage elastic modulus. Hence, by using the above resin sheet 130, 131, etc., the highly reliable light emitting module 1 can be provided.

The tensile storage elastic modulus of the resin sheet after thermally cured is within a range between 1 to 10 GPa at the temperature of −50 to 100° C., and a change in tensile storage elastic modulus is within a single digit (less than 10 times).

Example thermosetting resin sheets applicable are an epoxy-based resin, and further an acrylic-based resin, a styrene-based resin, an ester-based resin, an urethane-based resin, a melamine resin, a phenol resin, an unsaturated polyester resin, and a diallyl phthalate resin, and are replaceable with each other.

The measurement of the dynamic viscoelastic modulus in FIG. 13 was carried out using a measurement sample which had a length of 20 mm, a width of 7 mm, and a thickness of 0.06 mm, and under the conditions which were a tensile mode, a temperature rise speed of 2.5° C./min, a measurement cycle of 2.5 s, a frequency of 1 Hz, and a temperature range between 60 to 180° C. As for the measurement of the tensile storage elastic modulus in FIG. 14, such a measurement was carried out using a test sample which had a length of 20 mm, a width of 7 mm, and a thickness of 0.06 mm, and under the conditions which were a tensile mode, a temperature rise speed of 2° C./min, a measurement cycle of 3 s, a frequency of 2 Hz, and a temperature range between −60 and 280° C. In addition, the tensile elastic modulus in FIG. 14 is a value obtained through a scheme in compliance with the above JIS K7244-1 (ISO 6721).

Several embodiments of the present disclosure have been explained above, but those embodiments are merely presented as examples, and are not intended to limit the scope of the present disclosure. Those novel embodiments can be carried out in other various forms, and various omissions, replacements, and modifications can be made thereto without departing from the scope of the present disclosure. Those embodiments and modified forms thereof are within the scope and spirit of the present disclosure, and within the invention as recited in appended claims and the equivalent range thereto.

The invention claimed is:

1. A manufacturing method of a light emitting module comprising a light emitting element disposed between a first light transmissive insulator and a second light transmissive insulator, the light emitting module manufacturing method comprising:
forming a conductive circuitry layer on a surface of the first light transmissive insulator;
disposing a first light transmissive insulation resin sheet that is thermosetting on the surface of the first light transmissive insulator;
disposing the light emitting element on the first light transmissive insulation resin sheet;
disposing a second light transmissive insulation resin sheet that is thermosetting or thermoplastic on the light emitting element;
disposing the second light transmissive insulator on the second light transmissive insulation resin sheet; and
pressurizing and heating the first and second light transmissive insulators, the first and second light transmissive insulation resin sheets, and the light emitting element.

2. The light emitting module manufacturing method according to claim 1, wherein the first light transmissive insulation resin sheet that is thermosetting is provided between the first light transmissive insulator and the light emitting element, or between the light emitting element and the second light transmissive insulator.

3. The light emitting module manufacturing method according to claim 1, further comprising:
heating and pressurizing the first light transmissive insulation resin sheet that is thermosetting at a first temperature which is lower than a maximum softening temperature of the first light transmissive insulation resin sheet; and
heating the first light transmissive insulation resin sheet that is thermosetting at a second temperature that is equal to or higher than the maximum softening temperature of the first light transmissive insulation resin sheet.

4. The light emitting module manufacturing method according to claim 3, wherein when the first temperature is T1, and the maximum softening temperature of the first light transmissive insulation resin sheet is Mp, the first temperature T1 satisfies a conditional expression that is Mp−50° C.≤T1<Mp.

5. The light emitting module manufacturing method according to claim 3, wherein when the second temperature is T2, and the maximum softening temperature of the first light transmissive insulation resin sheet is Mp, the second temperature T2 satisfies a conditional expression that is Mp≤T2<Mp+50° C.

6. The light emitting module manufacturing method according to claim 1, wherein the first light transmissive insulation resin sheet that is thermosetting has a viscosity value between a packaging viscosity [C] of the first light transmissive insulation resin sheet and a fluidization preventive viscosity [D] of the first light transmissive insulation resin sheet at a maximum softening temperature of the first light transmissive insulation resin sheet.

7. The light emitting module manufacturing method according to claim 1, wherein the first light transmissive insulation resin sheet that is thermosetting has a viscosity value between a tacking viscosity [A] and a fluidization preventive viscosity [B] at temperatures between 25° C. and a maximum softening temperature of the first light transmissive insulation resin sheet.

8. The light emitting module manufacturing method according to claim 1, wherein the first light transmissive insulation resin sheet that is thermosetting has a characteristic viscosity value curve that is surrounded by a tacking viscosity [A], a fluidization preventive viscosity [B], a packaging viscosity [C] and a fluidization preventive viscosity [D].

9. The light emitting module manufacturing method according to claim 8, wherein the first light transmissive insulation resin sheet that is thermosetting has the characteristic viscosity value curve that is surrounded by [A] to [E] that has a pressurization connection viscosity [E] at a pressurization and heating temperature T1.

10. The light emitting module manufacturing method according to claim 1, wherein the first light transmissive insulation resin sheet that is thermosetting has a maximum softening temperature of 80 to 160° C.

11. The light emitting module manufacturing method according to claim 1, wherein the first light transmissive insulation resin sheet that is thermosetting has a viscosity of 500 to 10,000 poise at a maximum softening temperature of the first light transmissive insulation resin sheet.

12. The light emitting module manufacturing method according to claim 1, wherein the first light transmissive insulation resin sheet that is thermosetting has a viscosity of 500 to 1,000,000 poise during said disposing a light-emitting element on the first light transmissive insulation resin sheet.

13. The light emitting module manufacturing method according to claim 1, wherein the first light transmissive insulation resin sheet that is thermosetting has a characteristic viscosity value curve that is surrounded by [A] to [D] where [A] is dynamic viscosity of 1,000,000 poise and temperature of 25° C., [B] is dynamic viscosity of 500 poise and temperature of 25° C., [C] is dynamic viscosity of 10,000 poise and temperature equal to maximum softening temperature of the first light transmissive insulation resin sheet, and [D] is dynamic viscosity of 500 poise and temperature equal to maximum softening temperature of the first light transmissive insulation resin sheet.

14. The light emitting module manufacturing method according to claim 1, wherein the first light transmissive insulation resin sheet that is thermosetting has a characteristic viscosity value curve that is surrounded by [A] to [E] where [A] is dynamic viscosity of 1,000,000 poise and temperature of 25° C., [B] is dynamic viscosity of 500 poise and temperature of 25° C., [C] is dynamic viscosity of 10,000 poise and temperature equal to maximum softening temperature of the first light transmissive insulation resin sheet, [D] is dynamic viscosity of 500 poise and temperature equal to maximum softening temperature of the first light transmissive insulation resin sheet, and [E] is dynamic viscosity of 50,000 poise and temperature equal to a temperature during said pressurizing and heating.

15. A manufacturing method of a light emitting module comprising a first transmissive insulator having a conductive circuitry layer on an upper surface of the first transmissive insulator, a light emitting element having an electrode in electrical contact with the conductive circuitry layer, a second transmissive insulator arranged to be separated from the first transmissive insulator by a predetermined distance, a transmissive insulating resin layer filled between the first transmissive insulator and the second transmissive insulator and having thermosetting property, comprising:

disposing a transmissive insulating resin sheet constituting the transmissive insulating resin layer and having a viscosity of 1000000 poise or less on the upper surface of the first transmissive insulator;

disposing the light emitting element on an upper surface of the transmissive insulating resin sheet such that a surface of the light emitting element on which the electrode is formed faces the first transmissive insulator, and temporarily fixing the light emitting element to the transmissive insulating resin sheet;

arranging the second transmissive insulator on the light emitting element;

a first heating step of causing the electrode to reach a predetermined position of the conductive circuitry layer such that the electrode and the conductive circuitry layer are in electrical contact with each other after the viscosity becomes 50,000 poise or less, by heating and pressurizing a laminate including the transmissive insulating resin sheet and the light emitting element at a temperature lower than a maximum softening temperature of the transmissive insulating resin sheet and not lower than the maximum softening temperature by 50 degrees or more; and a second heating step of curing the transmissive insulating resin sheet in a state where the electrode is connected to the predetermined position of the conductive circuitry layer by heating the laminate at a temperature higher than the maximum softening temperature and not more than 50 degrees above the maximum softening temperature.

16. A manufacturing method of a light emitting module comprising a first transmissive insulator having a conductive circuitry layer on an upper surface of the first transmissive insulator, a light emitting element having an electrode in electrical contact with the conductive circuitry layer, a second transmissive insulator arranged to be separated from the first transmissive insulator by a predetermined distance, a transmissive insulating resin layer filled between the first transmissive insulator and the second transmissive insulator and having thermosetting property, comprising: disposing a first transmissive insulating resin sheet constituting a portion of the transmissive insulating resin layer on the upper surface of the first transmissive insulator; disposing the light emitting element on an upper surface of the first transmissive insulating resin sheet such that a surface of the light emitting element on which the electrode is formed faces the first transmissive insulator, and temporarily fixing the light emitting element to the first transmissive insulating resin sheet; disposing a second transmissive insulating resin sheet constituting a portion of the transmissive insulating resin layer on the light emitting element; a fourth arranging step of arranging the second transmissive insulator on the second transmissive insulating resin sheet; a first heating step of causing the electrode to reach a predetermined position of the conductive circuitry layer such that the electrode and the conductive circuitry layer are in electrical contact with each other by heating and pressurizing a laminate including the first and second transmissive insulating resin sheets and the light emitting element at a temperature lower than a maximum softening temperature of the first and second transmissive insulating resin sheets and not lower than the maximum softening temperature by 50 degrees or more; and a second heating step of curing the first and second transmissive insulating resin sheets in a state where the electrode is connected to the predetermined position of the conductive circuitry layer by heating the laminate at a temperature higher than the maximum softening temperature and not more than 50 degrees above the maximum softening temperature.

17. A manufacturing method of a light emitting module comprising a first transmissive insulator having a conductive circuitry layer on an upper surface of the first transmissive insulator, a light emitting element having an electrode in electrical contact with the conductive circuitry layer, a second transmissive insulator arranged to be separated from the first transmissive insulator by a predetermined distance, a transmissive insulating resin layer filled between the first transmissive insulator and the second transmissive insulator and having thermosetting property, comprising: disposing a first transmissive insulating resin sheet constituting a first portion of the transmissive insulating resin layer on the upper surface of the first transmissive insulator; disposing the light emitting element on an upper surface of the first transmissive insulating resin sheet such that a surface of the light emitting element on which the electrode is formed faces the first transmissive insulator, and temporarily fixing the light emitting element to the first transmissive insulating resin sheet; a first heating step of causing the electrode to reach a predetermined position of the conductive circuitry layer such that the electrode and the conductive circuitry layer are in electrical contact with each other by heating and pressurizing a laminate including the first transmissive insulating resin sheet and the light emitting element at a temperature lower than a maximum softening temperature of the first and second transmissive insulating resin sheets and not lower than the maximum softening temperature by 50 degrees or more; disposing a second transmissive insulating resin sheet constituting a second portion of the transmissive insulating resin layer and the second transmissive insulator on the light emitting element after the first heating step; and a second heating step of curing the first and second transmissive insulating resin sheets in a state where the electrode is connected to the predetermined position of the conductive circuitry layer by heating the laminate at a temperature higher than the maximum softening temperature and not more than 50 degrees above the maximum softening temperature.

18. The light emitting module manufacturing method according to claim 1, wherein:

said disposing a second light transmissive insulation resin sheet that is thermosetting or thermoplastic on the light emitting element, and said disposing the second light transmissive insulator on the second light transmissive insulation resin sheet, are performed in a sequence in which either:

said disposing a second light transmissive insulation resin sheet that is thermosetting or thermoplastic on the light emitting element, is performed before said disposing the second light transmissive insulator on the second light transmissive insulation resin sheet, or said disposing a second light transmissive insulation resin sheet that is thermosetting or thermoplastic on the light emitting element, is performed after said disposing the second light transmissive insulator on the second light transmissive insulation resin sheet.

19. The light emitting module manufacturing method according to claim 18, wherein:
said disposing a second light transmissive insulation resin sheet that is thermosetting or thermoplastic on the light emitting element,
is performed before said disposing the second light transmissive insulator on the second light transmissive insulation resin sheet.

20. The light emitting module manufacturing method according to claim 18, wherein:
said disposing a second light transmissive insulation resin sheet that is thermosetting or thermoplastic on the light emitting element,
is performed after said disposing the second light transmissive insulator on the second light transmissive insulation resin sheet.

21. The light emitting module manufacturing method according to claim 17, wherein: said disposing the second transmissive insulating resin sheet constituting the second portion of the transmissive insulating resin layer and the second transmissive insulator on the light emitting element is performed in a sequence in which either: the second transmissive insulating resin sheet constituting the second portion of the transmissive insulating resin layer is disposed on the light emitting element and then the second transmissive insulator is disposed on the second transmissive insulating resin sheet, or the second transmissive insulating resin sheet constituting the second portion of the transmissive insulating resin layer is disposed on the light emitting element after the second transmissive insulator is disposed on the second transmissive insulating resin sheet.

22. The light emitting module manufacturing method according to claim 21, wherein:
said disposing a second transmissive insulating resin sheet constituting a portion of the transmissive insulating resin layer on the light emitting element,
is performed before said disposing the second transmissive insulator on the second transmissive insulating resin sheet.

23. The light emitting module manufacturing method according to claim 21, wherein:
said disposing a second transmissive insulating resin sheet constituting a portion of the transmissive insulating resin layer on the light emitting element,
is performed after said disposing the second transmissive insulator on the second transmissive insulating resin sheet.

24. A manufacturing method of a light emitting module comprising:
a first light transmissive insulator having a conductor pattern divided into at least two regions on an upper surface thereof
a plurality of light emitting elements comprising at least a first light emitting element and a second light emitting element, the first light emitting element having first and second electrodes electrically contacting the two regions of the conductor pattern and protruding toward the conductor pattern;
a second light transmissive insulator disposed at a predetermined distance from the first light transmissive insulator,
a light transmissive insulation resin sheet filled between the first light transmissive insulator and the second light transmissive insulator and having a thermosetting property, a portion of the light transmissive insulation resin sheet having a thickness smaller than the height of the first light emitting element,
the first light transmissive insulator has a shape in which a portion where the first light emitting element is disposed projects outward and a portion between the first light emitting element and the second light emitting element is curved so as to be recessed,
the light emitting module manufacturing method comprising:
a first arranging step of disposing the light transmissive insulation resin sheet on an upper surface of the first light transmissive insulator;
a second arranging step of temporarily fixing the light emitting elements to the upper surface of the light transmissive insulation resin sheet having a dynamic viscosity of 500 poise or more and 1,000,000 poise or less so that the first and second electrodes oppose the two regions of the conductor pattern;
a first heating step of electrically connecting the first and second electrodes and the conductor pattern by heating and pressurizing a laminate comprising the light transmissive insulation resin sheet and the light emitting elements at a temperature lower than the softening temperature of the light transmissive insulation resin sheet and not lower than the softening temperature by 50 degrees or more wherein in a state in which the dynamic viscosity of the light transmissive insulation resin sheet is 50,000 poise or less, the first and second electrodes are caused to reach the predetermined portions of the two regions; and
a second heating step of filling the micro space between upper surfaces of the light emitting elements and the conductor pattern and curing the light transmissive insulation resin sheet softened through a state in which the dynamic viscosity is 10,000 poise or less by heating the laminate to a temperature higher than the softening temperature and not higher than the softening temperature by 50 degrees or more in a state in which the first and second electrodes are connected to predetermined positions of the two regions.

25. A manufacturing method of a light emitting module comprising
a first light transmissive insulator having a conductor pattern on an upper surface thereof,
a light emitting element having an electrode in electrical contact with the conductor pattern on the first light transmissive insulator; and
a light transmissive insulation resin sheet filled between the first light transmissive insulator and the light emitting element,
the light emitting module manufacturing method comprising:
a first arranging step of disposing the light transmissive insulation resin sheet on the upper surface of the first light transmissive insulator;
a second arranging step of temporarily fixing the light emitting element to an upper surface of the light transmissive insulation resin sheet having a dynamic viscosity of 1,000,000 poise or less so that the electrode faces a predetermined portion of the conductor pattern on the first light transmissive insulator;

a first heating step of electrically connecting the electrode and the conductor pattern by heating and pressurizing a laminate comprising the light transmissive insulation resin sheet and the light emitting element at a temperature lower than the softening temperature of the light transmissive insulation resin sheet and not lower than the softening temperature by 50 degrees or more wherein in a state in which the dynamic viscosity of the light transmissive insulation resin sheet is 50,000 poise or less, the electrode is caused to reach the predetermined portions of the conductor pattern; and a second heating step of curing the light transmissive insulation resin sheet in a state where the electrode is connected to the predetermined position of the conductor pattern by heating the laminate to a temperature higher than the softening temperature and not higher than the softening temperature by 50 degrees or more.

26. The manufacturing method according to claim 25, wherein:

the light emitting module further comprises a second light transmissive insulator disposed at a predetermined distance from the first light transmissive insulator, and the manufacturing method comprises a third arranging step of disposing the second light transmissive insulator above the light emitting element after the second arranging step.

27. The manufacturing method according to claim 25, wherein:

dynamic viscosity of the light transmissive insulation resin sheet in the second arranging step is 500 poise or more, and the light emitting element is temporarily fixed to the light transmissive insulation resin sheet by sinking in.

28. The manufacturing method according to claim 25, wherein:

in the second heating step, the light transmissive insulation resin sheet goes around the light emitting element without gaps after passing through a state in which the light transmitting insulation resin sheet has a dynamic viscosity of 10,000 poise or less.

29. The manufacturing method according to claim 25, wherein: in the second heating step, the light transmitting insulation resin sheet undergoes a state in which dynamic viscosity of the light transmissive insulation resin sheet is 10,000 poise or less, the light transmissive insulation resin sheet is softened and filled in a micro space bordered by electrodes protruding from an upper surface of the light emitting element toward the conductor pattern, the upper surface of the light emitting element, and the conductor pattern.

* * * * *